United States Patent
Abe et al.

(10) Patent No.: US 9,325,386 B2
(45) Date of Patent: Apr. 26, 2016

(54) POWER SUPPLYING MODULE FOR CONTACTLESS POWER SUPPLYING DEVICE, METHOD FOR USING POWER SUPPLYING MODULE OF CONTACTLESS POWER SUPPLYING DEVICE, AND METHOD FOR MANUFACTURING POWER SUPPLYING MODULE OF CONTACTLESS POWER SUPPLYING DEVICE

(75) Inventors: Hideaki Abe, Osaka (JP); Hiroyuki Yagyu, Osaka (JP); Wataru Tanaka, Osaka (JP); Shinichi Abe, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 547 days.

(21) Appl. No.: 13/823,975

(22) PCT Filed: Jan. 11, 2012

(86) PCT No.: PCT/JP2012/050353
§ 371 (c)(1),
(2), (4) Date: Mar. 15, 2013

(87) PCT Pub. No.: WO2012/102075
PCT Pub. Date: Aug. 2, 2012

(65) Prior Publication Data
US 2013/0175877 A1 Jul. 11, 2013

(30) Foreign Application Priority Data
Jan. 28, 2011 (JP) .................. 2011-017018

(51) Int. Cl.
*H02J 17/00* (2006.01)
*H04B 5/00* (2006.01)
(Continued)

(52) U.S. Cl.
CPC .............. *H04B 5/0037* (2013.01); *H01F 38/14* (2013.01); *H02J 17/00* (2013.01); *H05K 13/04* (2013.01); *Y10T 29/4902* (2015.01)

(58) Field of Classification Search
CPC ....................................................... H02J 17/00
USPC .......................................... 307/104; 320/108
See application file for complete search history.

(56) References Cited

U.S. PATENT DOCUMENTS 5,455,467 A * 10/1995 Young .................. G06F 1/1632
307/104
5,821,731 A 10/1998 Kuki et al.
(Continued)

FOREIGN PATENT DOCUMENTS

DE    WO 2009122355 A2 * 10/2009 .............. H02J 5/005
EP    2 490 318 A1    8/2012
(Continued)

OTHER PUBLICATIONS

English translation of International Preliminary Report on Patentability for corresponding International Application No. PCT/JP2012/050353 dated Jul. 30, 2013.
(Continued)

*Primary Examiner* — Fritz M Fleming
(74) *Attorney, Agent, or Firm* — Renner, Otto, Boisselle & Sklar, LLP

(57) ABSTRACT

Coil units equipped with primary coils having the same specification are provided in a power feeding module. Coil-unit intermeshing recess sections are formed on a printed circuit board to match each of the coil units. Pads for joining together with electrodes formed on the coil units are formed on the bottom faces of each of the coil-unit intermeshing recess sections. A plurality of coil units can be mounted onto the printed circuit board easily, by fitting each of the coil units into each of the coil-unit intermeshing recess sections and joining them together, which will enable manufacturing efficiency to be improved.

24 Claims, 20 Drawing Sheets

(51) Int. Cl.
*H05K 13/04* (2006.01)
*H01F 38/14* (2006.01)

(56) References Cited

U.S. PATENT DOCUMENTS

| | | | |
|---|---|---|---|
| 7,180,503 B2 | 2/2007 | Burr et al. | |
| 7,521,890 B2 * | 4/2009 | Lee | H02J 5/005 320/108 |
| 8,183,828 B2 * | 5/2012 | Tanabe | H02J 7/025 307/104 |
| 2009/0085706 A1 | 4/2009 | Baarman et al. | |
| 2009/0096413 A1 * | 4/2009 | Partovi | H01F 5/003 320/108 |
| 2009/0140691 A1 | 6/2009 | Jung | |
| 2010/0065352 A1 | 3/2010 | Ichikawa | |
| 2010/0219693 A1 | 9/2010 | Azancor et al. | |
| 2010/0289341 A1 | 11/2010 | Ozaki et al. | |
| 2010/0314946 A1 | 12/2010 | Budde et al. | |
| 2010/0327802 A1 * | 12/2010 | Sip | H02J 7/025 320/108 |
| 2012/0194127 A1 | 8/2012 | Koybayashi et al. | |
| 2012/0327802 A1 * | 12/2012 | Jung | H04W 36/0094 370/252 |

FOREIGN PATENT DOCUMENTS

| | | | | |
|---|---|---|---|---|
| JP | 58-9571 | | 2/1983 | |
| JP | 8-340602 | | 12/1996 | |
| JP | 9-102329 | A | 4/1997 | |
| JP | 9-199200 | A | 7/1997 | |
| JP | 2003-70188 | | 3/2003 | |
| JP | 2005-289101 | A | 10/2005 | |
| JP | 2006-121791 | A | 5/2006 | |
| JP | 2006-149168 | | 6/2006 | |
| JP | 2006-166570 | A | 6/2006 | |
| JP | 2008-273434 | | 11/2008 | |
| JP | 2009-129967 | A | 6/2009 | |
| JP | 2009-159685 | | 7/2009 | |
| JP | 2009-284695 | A | 12/2009 | |
| JP | 2010-508008 | A | 3/2010 | |
| JP | 2010-070048 | A | 4/2010 | |
| JP | 2010-252517 | A | 11/2010 | |
| KR | 2008-0086712 | A | 9/2008 | |
| KR | 100877646 | B1 * | 1/2009 | H02J 17/00 |
| MY | WO 2010056102 | A1 * | 5/2010 | H01R 13/6315 |
| TW | EP 1392089 | A1 * | 2/2004 | H01L 24/16 |
| TW | 200938017 | A | 9/2009 | |
| TW | 201103224 | A | 1/2011 | |
| WO | WO 2009/047768 | A2 | 4/2009 | |

OTHER PUBLICATIONS

Taiwanese Office Action for corresponding Taiwanese Application No. 101101817 dated Jan. 24, 2014 (with English translation).
Extended European Search Report for corresponding European Application No. 12739194.4 dated Feb. 23, 2015.
Japanese Office Action for corresponding Japanese Application No. 2011-017018 dated Jul. 29, 2014.
International Search Report for corresponding International Application No. PCT/JP2011/050353 mailed Apr. 17, 2012.

* cited by examiner

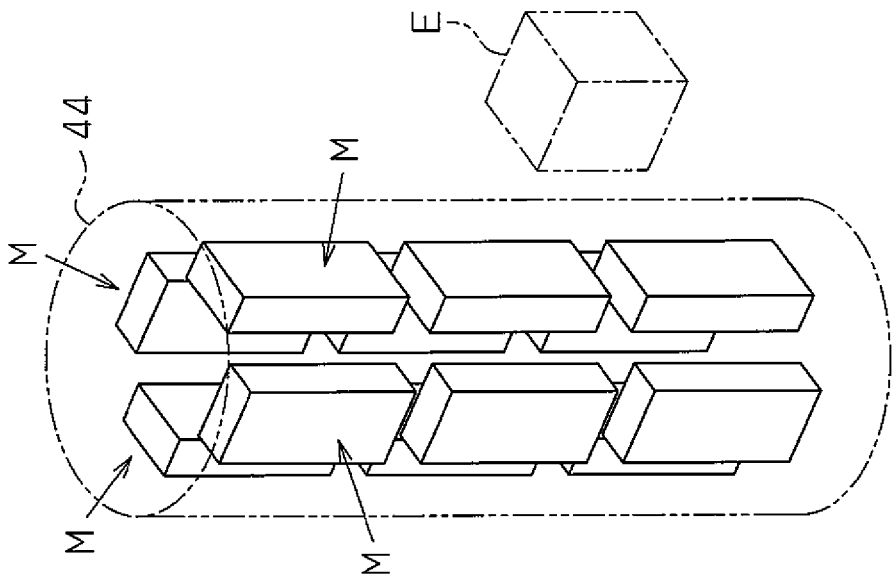
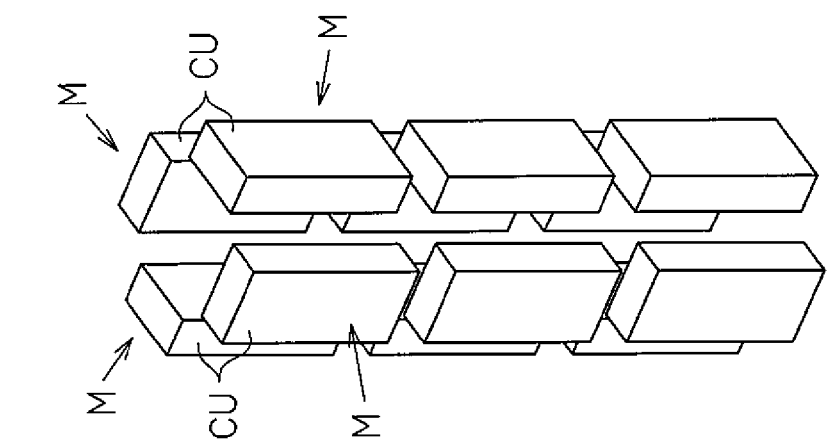

Fig.26(a)
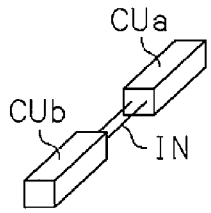
Fig.26(b)
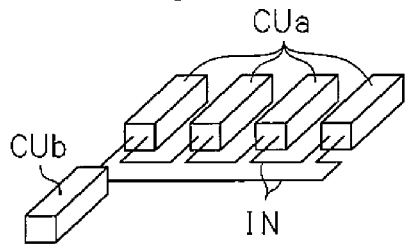
Fig.26(c)
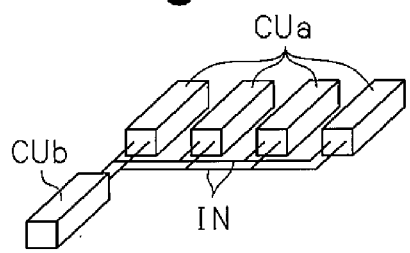
Fig.27
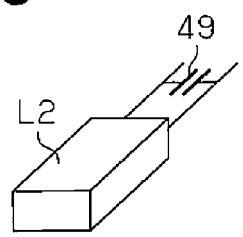
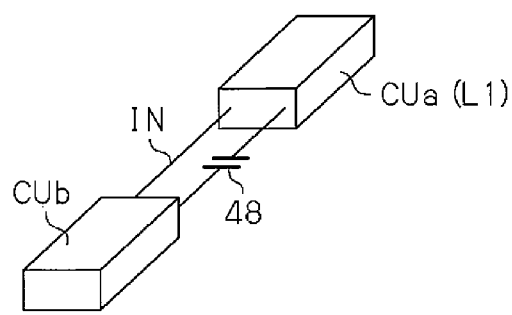

POWER SUPPLYING MODULE FOR CONTACTLESS POWER SUPPLYING DEVICE, METHOD FOR USING POWER SUPPLYING MODULE OF CONTACTLESS POWER SUPPLYING DEVICE, AND METHOD FOR MANUFACTURING POWER SUPPLYING MODULE OF CONTACTLESS POWER SUPPLYING DEVICE

TECHNICAL FIELD

The present invention relates to a power supplying module for a contactless power supplying device, a method for using the power supplying module of the contactless power supplying device, and a method for manufacturing the power supplying module of the contactless power supplying device.

BACKGROUND ART

In recent years, various types of practical systems that use a contactless power supplying technique have been proposed. For example, a large number of power supplying modules, each having a plurality of power supplying coils, are laid along a transfer route. A moving body including a power receiving coil is arranged on the transfer route. The moving body generates secondary power at the power receiving coil through electromagnetic induction resulting from excitation of the power supplying coils in the power supplying modules laid along the transfer route. The secondary power is used to drive, for example, a motor and thus move the moving body (patent document 1).
Patent Document 1: Japanese Laid-Open Patent Publication No. 2006-121791

SUMMARY OF THE INVENTION

In the contactless power supplying system, each of the large number of power supplying modules laid along the transfer route is configured by integrally forming a single power supplying coil and a power supplying circuit that controls excitation of that power supplying coil. The power supplying circuit includes a central processing unit (CPU) and a read-only semiconductor memory (ROM) just for the single power supplying coil. The power supplying circuit is thus a complex and expensive power supplying module. Furthermore, each power supplying module has a complex structure since a commercial power supply is input to each power supplying module. Therefore, each power supplying module is very expensive.

Patent document 1 discloses a method for laying out the power supplying modules along the transfer route. The task of assembling the complex power supplying modules on the transfer route is very cumbersome and requires effort and time.

Therefore, there is a limitation to the freedom of design for an area where the power supplying modules can be laid out and supplied with power.

It is an object of the present invention to provide a power supplying module for a contactless power supplying device, a method for using the power supplying module of the contactless power supplying device, and a method for manufacturing the power supplying module of the contactless power supplying device that has a high degree of freedom for design, allows for contactless power supply in various modes, and enables manufacturing that is easy and performed within a short period of time.

A power supplying module for a contactless power supplying device according to the present invention includes a plurality of coil units. Each of the coil units includes a primary coil and one or more first terminals. When the primary coil is excited and a secondary coil of a device is arranged adjacent to the primary coil, secondary power is generated by electromagnetic induction at the secondary coil, and the secondary power is supplied to a load of the device. A printed wiring substrate includes a plurality of first layout regions respectively defined for arrangement of the coil units. Each of the first layout regions includes one or more second terminals for connection to the one or more first terminals of the corresponding coil unit. One or more wires are formed on the printed wiring substrate to drive the coil unit arranged in each of the first layout regions. The coil units are arranged on the printed wiring substrate by arranging the coil units in the first layout regions of the printed wiring substrate and connecting the one or more second terminals of each first layout region to the one or more first terminals of each coil unit.

In the above configuration, the first layout regions are defined to set a linear power suppliable region in which the coil units are arranged on the printed wiring substrate in a single line in either one of a front-back direction and a left-right direction.

In the above configuration, the first layout regions are defined to set a planar power suppliable region in which the coil units are arranged in front-back and left-right directions on the printed wiring substrate is set.

In the above configuration, the coil units arranged in the front-back and left-right directions on the printed wiring substrate satisfy "A"<"F" and "B"<"F", where "A" represents the distance between two coil units adjacent in the left-right direction, "B" represents the distance between two coil units adjacent in the front-back direction, and "F" represents the longest distance among a side and a diameter or a diagonal line of the secondary coil of a device, which includes the secondary coil having the smallest coil area, among devices usable for the power supplying module.

In the above configuration, the plurality of first layout regions are defined to set a circular or a sector-shaped power suppliable region so that the coil units are arranged at different angles relative to the printed wiring substrate.

In the above configuration, the coil units have the same specification.

In the above configuration, each of the coil units includes a coil portion having the primary coil, a drive portion with an inverter circuit that excites the primary coil, and an insulating resin that integrally molds the coil portion and the drive portion.

In the above configuration, each of the coil units includes a reception unit that receives a signal from the device.

In the above configuration, each of the coil units includes at least one of a device authentication unit, a metal detection unit, and a data transmission/reception unit, which transmits and receives data to and from the device.

In the above configuration, the primary coils of each of the coil units are wound around a core formed by a magnetic body.

The above configuration includes a resonance capacitor connected to the primary coil of each of the coil units.

In the above configuration, the primary coil of each of the coil units has a cuboid shape.

The above configuration includes an insulator arranged on the coil units arranged on the printed wiring substrate. Power suppliable to the device is set by changing a thickness of the insulator.

In the above configuration, each of the first layout regions formed on the printed wiring substrate is a coil unit fitting recess into which the coil unit is fitted. Each of the coil unit fitting recesses includes a bottom surface, and the one or more second terminals formed on the bottom surface of each of the coil unit fitting recesses and connected to the one or more first terminals of the coil unit that is fitted.

The above configuration includes a system unit that centrally drives and controls each of the coil units and includes a plurality of third terminals, and a second layout region defined and formed on the printed wiring substrate for arrangement of the system unit. The second layout region includes a plurality of fourth terminals respectively connected to the third terminals of the system unit, and the third terminals of the system unit and the one or more first terminals of each coil unit are electrically connected.

The above configuration includes a power suppliable region section that is defined on the printed wiring substrate and is applicable to a device of a further standardized specification. A plurality of coil units for the device of the further standardized specification are arranged in the power suppliable region section.

The above configuration includes a magnetic member that electromagnetically shields the coil unit in the coil units arranged on the printed wiring substrate.

The above configuration includes planarly arranging a plurality of identical power supplying modules in conformance with a power suppliable region.

The above configuration includes three-dimensionally arranging a plurality of identical power supplying modules in conformance with a power suppliable region.

A method for manufacturing a power supplying module of a contactless power supplying device according to the present invention includes preparing a printed wiring substrate and a plurality of coil units. Each of the coil units includes a primary coil and one or more first terminals. When the primary coil is excited and the secondary coil of the device is arranged adjacent to the primary coil, secondary power is generated by electromagnetic induction at the secondary coil, and the secondary power is supplied to a load of the device. The printed wiring substrate includes a plurality of first layout regions respectively defined for arrangement of the coil units, one or more second terminals formed in each of the first layout regions for connection to the one or more first terminals of the corresponding coil unit, and one or more wires formed on the printed wiring substrate to drive the coil unit arranged in each of the first layout regions. The method further includes arranging the coil units in at least one of the first layout regions of the printed wiring substrate, connecting the one or more second terminals of the first layout region in which the coil units are arranged and the one or more first terminals of the corresponding coil unit, and coupling the plurality of coil units to the printed wiring substrate.

In the above configuration, the arranging includes arranging the coil units in all of the first layout regions formed in the printed wiring substrate, and respectively coupling the coil units to all of the first layout regions of the printed wiring substrate.

In the above configuration, the arranging includes selecting one or more of the first layout regions formed in the printed wiring substrate in accordance with a preset power suppliable region, arranging the coil unit in the selected first layout region on the printed wiring substrate, and coupling the coil units to the selected first layout region on the printed wiring substrate.

In the above configuration, the coil units have the same specification.

In the above configuration, the first layout regions formed on the printed wiring substrate are coil unit fitting recesses to which the coil units are fitted. Each of the coil unit fitting recesses includes a bottom surface, and the one or more second terminals formed on the bottom surface of each of the coil unit fitting recesses and connected to the one or more first terminals of the coil unit that is fitted.

In the above configuration, the one or more second terminals formed in each of the first layout regions on the printed wiring substrate are flip-chip connected to the one or more first terminals formed in each of the coil units.

In the above configuration, the one or more second terminals formed in each of the first layout regions on the printed wiring substrate are connected by a male-type contact plug terminal and a female-type contact plug terminal to the one or more terminals formed in each of the coil units.

The present invention provides a power supplying module for a contactless power supplying device having a high degree of freedom for design, allowing for contactless power supply in various modes, and enabling manufacturing that is easy and performed within a short period of time.

BRIEF DESCRIPTION OF THE DRAWINGS

FIG. 21(*a*) is a diagram showing the arrangement of a plurality of power supplying modules, and FIG. 21(*b*) is a diagram showing the plurality of power supplying modules arranged in a column.

FIG. 26(a) is a diagram showing a connecting state of the coil unit and the drive unit, FIG. 26(b) is a diagram showing a connecting state of the drive unit for coil units connected in series, and FIG. 22(c) is a diagram showing a connecting state of the drive unit for coil units connected in parallel.

FIG. 27 is a diagram showing another example of the second embodiment in which a resonance capacitor is connected to the primary coil and the secondary coil.

EMBODIMENTS OF THE INVENTION

First Embodiment

A first embodiment of a contactless power supplying device according to a contactless power supplying system of the present invention will now be described with reference to the drawings.

Figure 1:
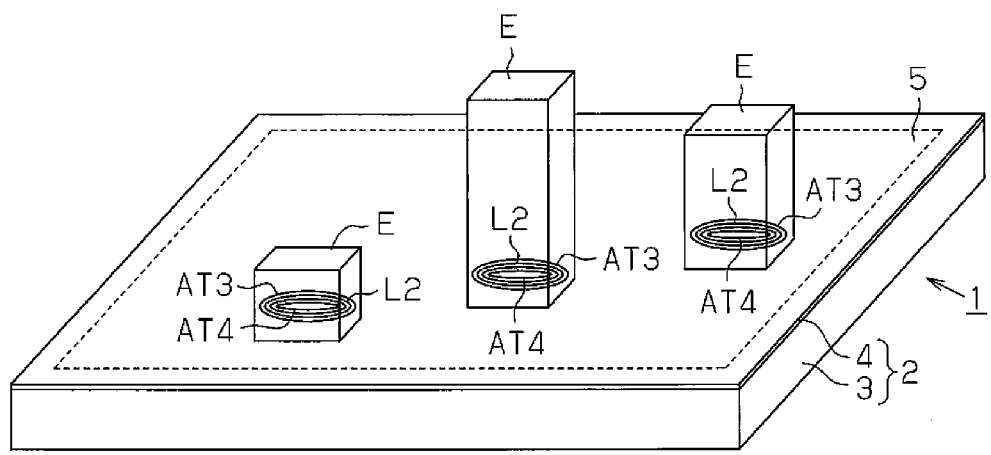
FIG. 1 is an overall perspective view of a contactless power supplying device of a first embodiment.

As shown in FIG. 1, a contactless power supplying device 1 includes a housing 2. The housing 2 includes a tetragonal box body 3, which has an upper opening, and a top plate 4, which is formed by an insulating body and closes the opening of the box body 3. The top plate 4 includes a setting surface 5, which is an upper surface of the contactless power supplying device 1 for mounting a device E to supply power in a contactless manner.

Figure 2:
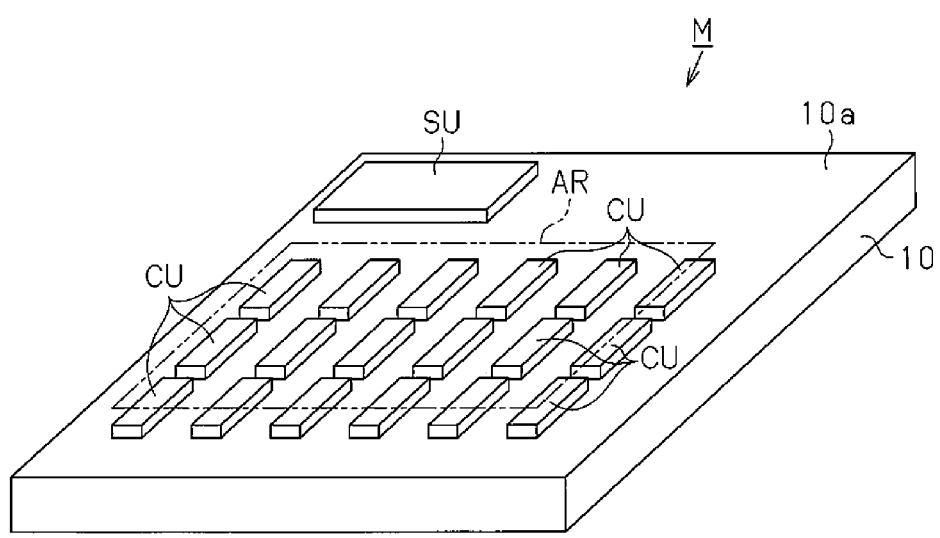
FIG. 2 is an overall perspective view of a power supplying module.

As shown in FIG. 2, a power supplying module M is accommodated in the housing 2. The power supplying module M includes a printed wiring substrate 10, a plurality of coil units CU, and a system unit SU. The plurality of coil units CU are arranged on the printed wiring substrate 10 and electrically connected to the printed wiring substrate 10. The system unit SU is arranged on the printed wiring substrate 10 and electrically connected to the printed wiring substrate 10. The system unit SU centrally controls the coil units CU.

Figure 3:
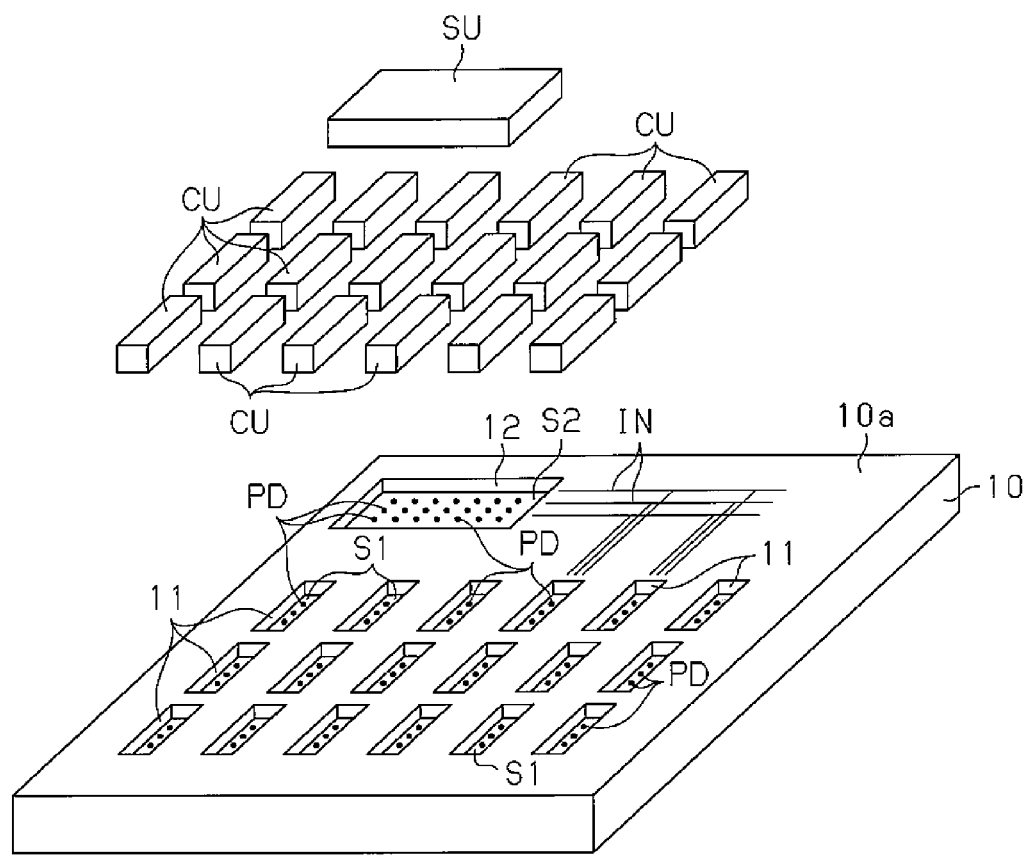
FIG. 3 is an exploded perspective view of the power supplying module.

In the present embodiment, the printed wiring substrate 10 is a multi-layered printed wiring substrate. As shown in FIG. 3, the printed wiring substrate 10 includes an upper surface 10a. The upper surface 10a includes a total of 18 coil unit fitting recesses 11, three in a front-back direction and six in a left-right direction. In the present embodiment, each coil unit fitting recess 11 is a rectangular recess having a long side that extends in the front-back direction. An interval between adjacent coil unit fitting recesses 11 in the left-right direction is fixed. The coil unit CU is fitted into the coil unit fitting recess 11. The coil unit CU includes electrodes P having a plurality of external input/output terminals (see FIG. 4).

A system unit fitting recess 12 is formed on a left back side of the upper surface 10a of the printed wiring substrate 10. In the present embodiment, the length in the front-back direction of the system unit fitting recess 12 is the same as the length in the front-back direction of the coil unit fitting recess 11. The length in the left-right direction of the system unit fitting recess 12 is longer than the length in the left-right direction of the coil unit fitting recess 11. The system unit SU for drive controlling each coil unit CU is fitted into the system unit fitting recess 12. The system unit SU includes electrodes P having a plurality of external input/output terminals (see FIG. 6).

Each coil unit fitting recess 11 includes a bottom surface S1. Each bottom surface S1 includes a plurality of pads PD, each of which is electrically connected to the electrodes P of the plurality of external input/output terminals of the coil unit CU (see FIG. 4).

Figure 6:
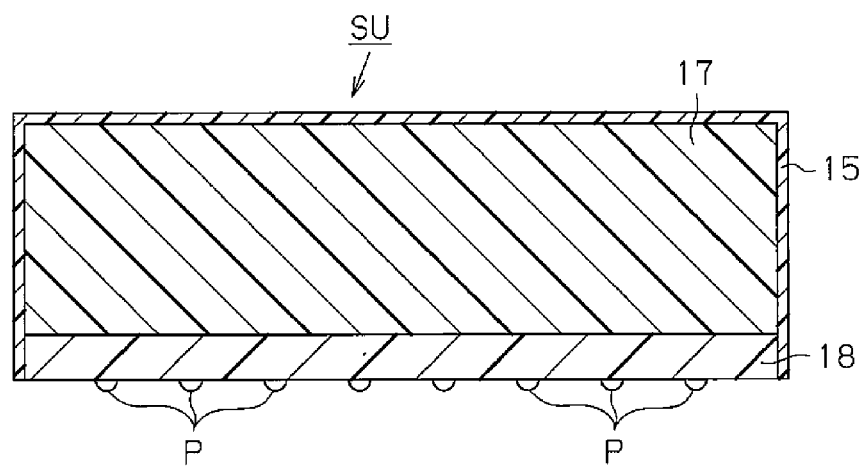
FIG. 6 is a cross-sectional view of a system unit.

Each bottom surface S2 of the system unit fitting recess 12 of the printed wiring substrate 10 includes a plurality of pads PD, each of which is electrically connected to the electrodes P of the plurality of external input/output terminals of the system unit SU (see FIG. 6).

The printed wiring substrate 10 includes a plurality of wires IN for electrically connecting each coil unit CU and the system unit SU. As shown in FIG. 2, each coil unit CU and the system unit SU are electrically connected through the plurality of wires IN by fitting the system unit SU to the system unit fitting recess 12 and fitting the coil unit CU to each coil unit fitting recess 11.

Coil Unit CU

Figure 4:
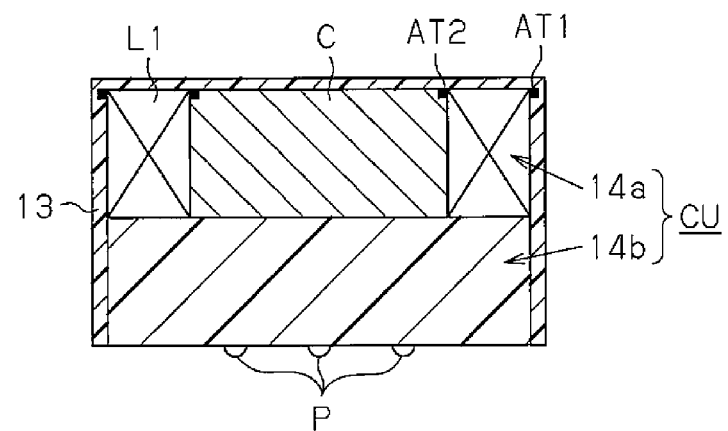
FIG. 4 is a cross-sectional view of a coil unit.
Figure 5:
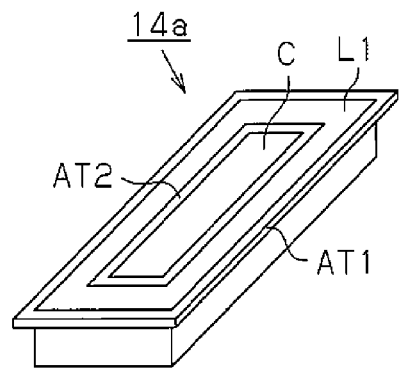
FIG. 5 is an overall perspective view of a coil portion of the coil unit.

The material, shape, and size of each coil unit CU have the same specification. As shown in FIG. 3, each coil unit CU is a rectangular parallelepiped so that each coil unit CU can be fitted into the coil unit fitting recess 11. Each coil unit CU has outer side surfaces including a lower surface. As shown in FIG. 4, the outer side surface excluding the lower surface of each coil unit CU is molded from an insulating resin 13. As shown in FIG. 4 and FIG. 5, each coil unit CU is formed by integrating a coil portion 14a and a drive portion 14b, which is configured by resin molding a circuit substrate having circuit elements of various types of circuits such as an inverter circuit for excitation driving a primary coil L1 to the lower surface of the coil portion 14a. Each coil portion 14a includes a rectangular parallelepiped-shaped core C, which has a large magnetic permeability such as ferrite core, the primary coil L1 wound around the core C, and the lower surface. Each drive portion 14b includes the circuit substrate, which includes circuit elements of various types of circuits such as the inverter circuit for excitation driving the primary coil L1, and a lower surface. Each circuit substrate is resin molded to the lower surface of the coil portion 14a. In other words, each coil unit CU of the present embodiment is an inverter integrated coil unit.

Each coil portion 14a includes a signal reception antenna AT1 and a metal detection antenna AT2. Each signal reception antenna AT1 is arranged to surround the primary coil L1 on an outer side of the upper end of the primary coil L1 in the coil portion 14a and fixed to the primary coil L1. Each metal detection antenna AT2 is arranged to surround the core C at an inner side of the upper end of the primary coil L1, and is fixed to the primary coil L1.

As shown in FIG. 4, the electrodes P having the plurality of external input/output terminals are formed on the lower surface of each drive portion 14b (surface on the bottom surface S1 side of the coil unit fitting recess 11). The electrodes P having the plurality of external input/output terminals are respectively electrically connected to the plurality of pads PD on the printed wiring substrate 10. Therefore, in each coil unit CU molded from the insulating resin 13, only the plurality of electrodes P are formed in a projecting manner from the lower surface of each coil unit CU.

As shown in FIG. 2, when the inverter integrated coil unit CU fitted into each coil unit fitting recess 11 is electrically connected to the wire IN formed on the printed wiring substrate 10, the upper surface of the coil unit CU projects from the upper surface 10a of the printed wiring substrate 10.

The plurality of electrodes P of each coil unit CU and the plurality of pads PD formed on the bottom surface S1 of each coil unit fitting recess 11 are joined by applying pressure and ultrasonic waves to the coil unit CU (e.g., flip-chip) toward the bottom surface of the coil unit fitting recess 11.

A power suppliable region AR is a region that surrounds a total of 18 coil units, three in the front-back direction and six in the left-right direction, arranged on the printed wiring substrate 10 at the upward position of the printed wiring substrate 10. That is, when changing the power suppliable region AR, the power suppliable region AR can be easily changed by simply changing the layout of the plurality of coil units CU arranged on the printed wiring substrate 10.

A large number of coil unit fitting recesses 11 of the printed wiring substrate 10 may be formed in advance, the predetermined plurality of coil unit fitting recesses 11 may be selected from the large number of coil unit fitting recesses 11 in accordance with the desired power suppliable region AR of the user, and the plurality of coil units CU may be fitted into the plurality of selected coil unit fitting recesses 11. In this case, various power suppliable regions AR requested by the user can be easily selected by simply selecting the coil unit fitting recess 11 as requested by the user, and fitting the coil unit CU to the plurality of selected coil unit fitting recesses 11.

The arrangement interval of the coil units CU can also be easily set. The supplying power requested by the user can be selected by simply changing the arrangement interval of the coil units CU.

System Unit SU)

As shown in FIG. 3, the system unit SU is a rectangular parallelepiped so that the system unit SU can be fitted into the system unit fitting recess 12. As shown in FIG. 6, the outer side surface excluding the lower surface of the system unit SU is molded from an insulating resin 15. The system unit SU includes a system control unit 36 (see FIG. 8) including a microcomputer that centrally controls the drive portion 14b of each coil unit CU. The system unit SU also includes a circuit substrate 18, on which a device 17 is configured by resin molding a power supply circuit and the like. The circuit substrate 18 requests for drive power to each coil unit CU. The circuit substrate 18 is molded from the insulating resin 15.

The system unit SU (circuit substrate 18) includes a lower surface (surface on the bottom surface S2 side of the system unit fitting recess 12) provided with the electrodes P of the plurality of external input/output terminals, each of which is electrically connected to the plurality of pads PD on the printed wiring substrate 10 formed in correspondence with the system unit SU. Therefore, in the system unit SU molded from the insulating resin 15, only the plurality of electrodes P are formed projecting from the lower surface of the system unit SU. As shown in FIG. 2, when the system unit SU fitted into the system unit fitting recess 12 is electrically connected to the printed wiring substrate 10, the upper surface of the system unit SU projects from the upper surface 10a of the printed wiring substrate 10.

Each electrode P of the system unit SU and each pad PD formed on the bottom surface S2 of the system unit fitting recess 12 are joined by applying pressure and ultrasonic waves to the system unit SU (e.g., flip-chip) toward the bottom surface of the system unit fitting recess 12 in the same manner as described above.

Each coil unit CU is driven based on a control of the system unit SU. That is, the primary coil L1 of each coil unit CU is excited alone or is excited in cooperation with another primary coil L1.

The plurality of (18 in the present embodiment) coil units CU can thus be easily coupled to the printed wiring substrate 10 by simply fitting the coil unit CU into each coil unit fitting recess 11 formed in the printed wiring substrate 10 and joining each coil unit fitting recess 11 with the coil unit CU. This improves the manufacturing efficiency of the contactless power supplying device 1. Furthermore, since each coil unit CU has the same specification and can be mass-produced, the coil unit CU can be formed with low costs. Moreover, the number of components and the manufacturing steps of the coil unit CU are fewer, and the component management is also easier compared to when coupling coil units of different specifications.

The system unit SU can be easily coupled to the printed wiring substrate 10 by simply fitting the system unit SU into the system unit fitting recess 12 formed in the printed wiring substrate 10 and joining the system unit fitting recess 12 with the system unit SU. Furthermore, the system unit SU is electrically connected to each coil unit CU by the plurality of wires IN of the printed wiring substrate 10. Thus, the wiring step of the system unit SU and each coil unit CU is very simple, and the manufacturing efficiency of the contactless power supplying device 1 can be improved.

The power supplying module M including the printed wiring substrate 10, to which the system unit SU and the plurality of coil units CU are assembled, is accommodated in the box body 3 of the housing 2. The box body 3 of the housing 2 is closed with the top plate 4. When the box body 3 is closed with the top plate 4, the upper surface of each coil unit CU is arranged at a position proximate to the lower surface of the top plate 4, and the device E is set on the setting surface 5 of the top plate 4.

Device E

As shown in FIG. 1, the device E set on the setting surface 5 of the contactless power supplying device 1 includes a secondary coil L2. The secondary coil L2 of the device E is excited and supplied with power through the excitation of the primary coil L1 of the contactless power supplying device 1, and supplies the supplied secondary power to a load Z (see FIG. 8) of the device E.

As shown in FIG. 1, a transmission/reception antenna AT3 is arranged to surround the secondary coil L2 at an outer side of the secondary coil L2 of the device E. When set on the setting surface 5 of the contactless power supplying device 1, the device E exchanges data and information through wireless communication with the drive portion 14b of the coil unit CU through the signal reception antenna AT1 surrounding the primary coil L1 of the coil unit CU located immediately below the device E.

A metal detection antenna AT4 is arranged at an inner side of each secondary coil L2. The metal detection antenna AT4 detects a metal piece arranged between the setting surface 5 and the device E when the device E is set on the setting surface 5.

The relative position of the plurality of coil units CU, that is, the formation position (first layout region) of each coil unit fitting recess 11 is set based on the one of the devices E, which may be used for the power supplying module M, including the secondary coil L2 having the smallest coil area.

Figure 7:
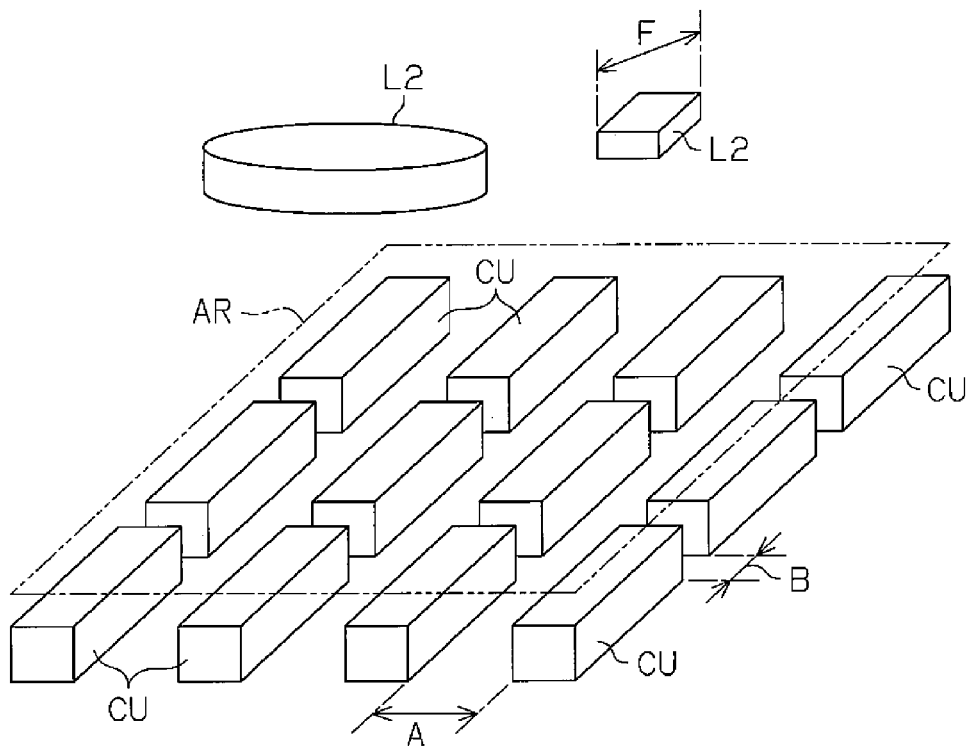
FIG. 7 is schematic diagram showing the layout of the coil units on a printed wiring substrate.

In detail, if the plurality of coil units CU are arranged in the front-back and left-right directions, that is, in the planar direction, as shown in FIG. 7, the distance between two coil units CU adjacent in the left-right direction is represented by "A", and the distance between two coil units CU adjacent in the front-back direction is represented by "B".

The one of the devices that can be used for the contactless power supplying device 1 (power supplying module M) including the secondary coil L2 having the smallest coil area is selected. The one among the side and the diameter or the diagonal line of the selected device E with the secondary coil L2 having the smallest coil area is set as distance "F".

Each coil unit CU is arranged on the printed wiring substrate 10 so as to satisfy the relationships "A"<"F" and "B"<"F".

If such conditions are satisfied, wherever the secondary coil L2 of the device E is arranged on the power suppliable region AR, at least a portion of the primary coil L1 overlaps with the secondary coil L2 of the device E immediately below the secondary coil L2. By avoiding a situation in which there are no primary coils L1 immediately below the secondary coil L2 of the subject device E, a large decrease in the magnetic flux density of the power supplying surface is prevented. The secondary coil L2 may generate a minimum induced electromotive force regardless of where the secondary coil L2 is arranged on the power suppliable region AR. This obtains the minimum voltage required and the required output for the device E.

Electrical Configuration

The electrical configuration of the contactless power supplying device 1 (power supplying module M) and the device will now be described with reference to FIG. 8.

Figure 8:
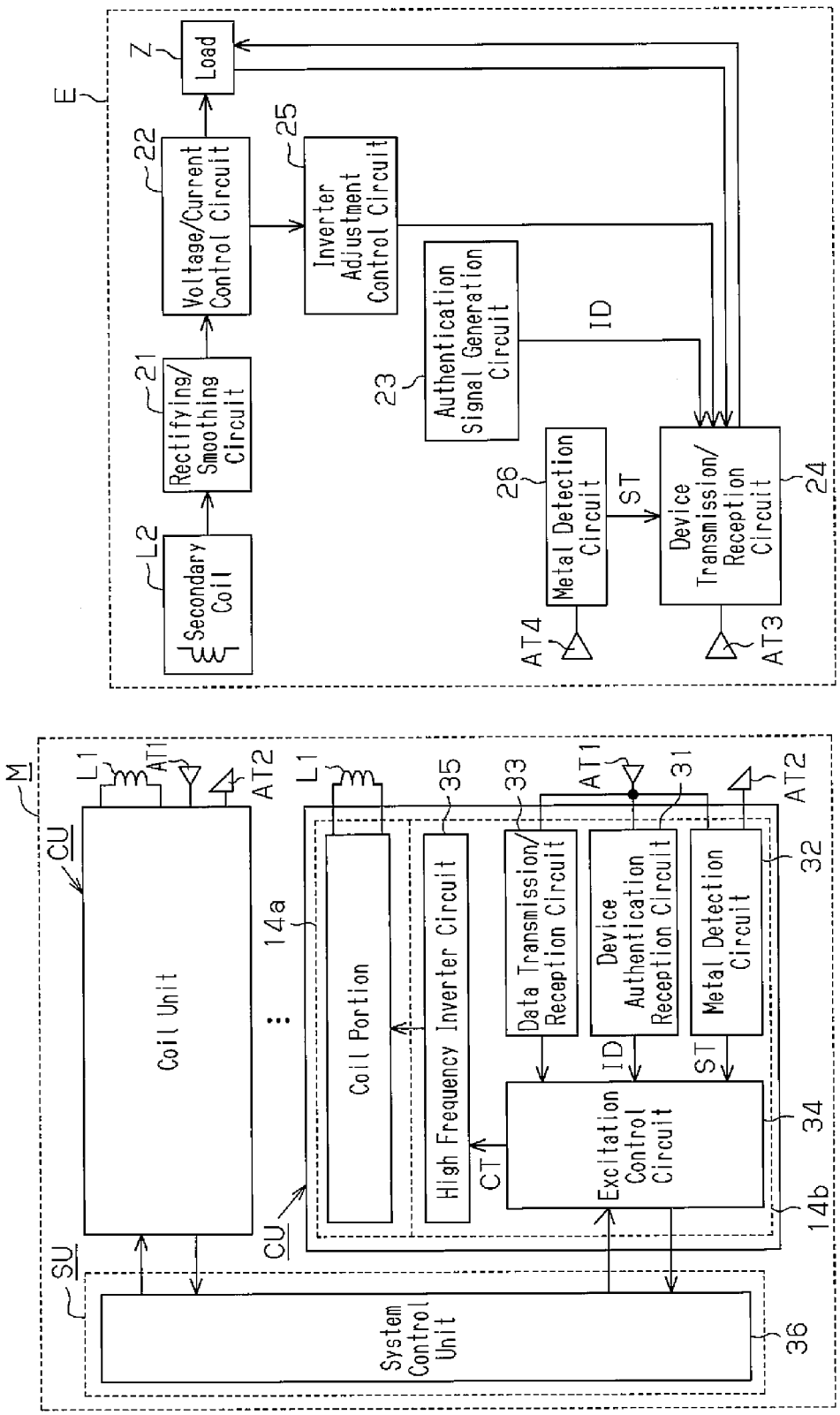
FIG. 8 is an electric circuit diagram showing an electrical configuration of the contactless power supplying device.

As shown in FIG. 8, the device E includes a rectifying/smoothing circuit 21, a voltage/current control circuit 22, an authentication signal generation circuit 23, a device transmission/reception circuit 24, an inverter adjustment control circuit 25, a metal detection circuit 26, and a load Z. The secondary coil L2 of the device E is excited and supplied with power through the excitation of the primary coil L1 of the power supplying module M (coil unit CU), and outputs the supplied secondary power to the rectifying/smoothing circuit 21. The rectifying/smoothing circuit 21 converts the secondary power to a DC (Direct Current) voltage without ripples, and outputs the DC voltage to the voltage/current control circuit 22. The voltage/current control circuit 22 voltage/current controls the DC voltage, and supplies the DC voltage to the load Z of the device E.

The authentication signal generation circuit 23 generates a device authentication signal ID for the contactless power supplying device 1 indicating that the device E is the one that is to receive power from the contactless power supplying device 1. The device authentication signal ID generated by the authentication signal generation circuit 23 is output to the device transmission/reception circuit 24. The device transmission/reception circuit 24 is connected to the transmission/reception antenna AT3, and transmits the device authentication signal ID to the contactless power supplying device 1 through the transmission/reception antenna AT3.

The device transmission/reception circuit 24 exchanges data with the load Z to acquire data on the present electrical state of the load Z. The device transmission/reception circuit 24 transmits the acquired data to the contactless power supplying device 1 through the transmission/reception antenna AT3.

Furthermore, the inverter adjustment control circuit 25 is connected to the device transmission/reception circuit 24. The inverter adjustment control circuit 25 controls the excitation state of the primary coil L1 of the power supplying module M in accordance with the condition of the voltage/current control circuit 22. The inverter adjustment control circuit 25, for example, calculates the drive capacity of the voltage/current control circuit 22 for the load Z that continuously changes, and transmits the data of the drive capacity to the contactless power supplying device 1 through the transmission/reception antenna AT3.

The device transmission/reception circuit 24 is connected to the metal detection circuit 26. The metal detection circuit 26 is connected to the metal detection antenna AT4. The metal detection antenna AT4 detects a metal piece arranged between the setting surface 5 and the device E. When the metal detection antenna AT4 detects a metal piece arranged between the setting surface 5 and the device E, the metal detection circuit 26 transmits a metal-present signal ST to the device transmission/reception circuit 24. The device transmission/reception circuit 24 transmits the metal-present signal ST to the contactless power supplying device 1 through the transmission/reception antenna AT3.

Power Supplying Module M)

As shown in FIG. 8, the drive portion 14b arranged in each coil unit CU includes a device authentication reception circuit 31, a metal detection circuit 32, a data transmission/reception circuit 33, an excitation control circuit 34, and a high frequency inverter circuit 35.

The device authentication reception circuit 31 is connected to the signal reception antenna AT1 of the coil portion 14a of the coil unit CU. When the device E is set on the setting surface 5 immediately above the coil unit CU, the device authentication reception circuit 31 receives the transmission signal transmitted from the device transmission/reception circuit 24 of the device E through the signal reception antenna AT1. The device authentication reception circuit 31 extracts the device authentication signal ID indicating that the device E is the device E that can receive power supply from the received transmission signal. After extracting the device authentication signal ID from the transmission signal, the device authentication reception circuit 31 outputs the device authentication signal ID to the excitation control circuit 34.

The metal detection circuit 32 is connected to the metal detection antenna AT2 arranged in the coil portion 14a. The metal detection circuit 32 detects whether or not a metal piece is set on the setting surface 5 immediately above or proximate to the coil unit CU through the metal detection antenna AT2. When detecting that a metal piece is set on the setting surface 5, the metal detection circuit 32 outputs the metal-present signal ST to the excitation control circuit 34.

When the device E is set on the setting surface 5 immediately above the coil unit CU, the metal detection circuit 32 receives the transmission signal transmitted from the device transmission/reception circuit 24 of the device E through the signal reception antenna AT1. The metal detection circuit 32 extracts the metal-present signal ST from the received transmission signal. When extracting the metal-present signal ST from the transmission signal, the metal detection circuit 32 outputs the metal-present signal ST to the excitation control circuit 34.

The data transmission/reception circuit 33 is connected to the signal reception antenna AT1 of the coil portion 14a. When the device E is set on the setting surface 5 immediately above the coil unit CU, the data transmission/reception circuit 33 receives the transmission signal transmitted from the device transmission/reception circuit 24 of the device E through the signal reception antenna AT1. The data transmission/reception circuit 33 extracts various types of data from the device E from the received transmission signal. When extracting the various types of data from the transmission signal, the data transmission/reception circuit 33 outputs such data to the excitation control circuit 34.

The device authentication signal ID from the device authentication reception circuit 31 that is presently output, the metal-present signal ST from the metal detection circuit 32, and the various types of data from the data transmission/reception circuit 33 are input to the excitation control circuit 34. The excitation control circuit 34 adds a position identification signal, which identifies its coil unit CU, to the device authentication signal ID that is presently input, the metal-present signal ST, and the various types of data. The excitation control circuit 34 outputs the device authentication signal ID, the metal-present signal ST, the various types of data, and the position identification signal to the system control unit 36 arranged in the system unit SU through the plurality of wires IN of the printed wiring substrate 10.

The excitation control circuit 34 waits for a permission signal from the system control unit 36 when outputting the device authentication ID, the metal-present signal ST, and the various types of data.

The system control unit 36 outputs to the excitation control circuit 34 the permission signal for exciting and driving the primary coil L1 of the coil unit CU to supply power when the device authentication signal ID is input. The excitation control circuit 34 outputs a drive control signal CT for exciting and driving the primary coil L1 to supply power to the high frequency inverter circuit 35 arranged in the drive portion 14b when the permission signal from the system control unit 36 is input.

The system control unit 36 does not output the permission signal even if the device authentication signal ID is input when the metal-present signal ST is input from the excitation control circuit 34. Therefore, the excitation control circuit 34 does not output the drive control signal CT for excitation driving the primary coil L1 to the high frequency inverter circuit 35.

Furthermore, the system control unit 36 stops the output of the permission signal when the device authentication signal ID from the excitation control circuit 34 is no longer input while outputting the permission signal. Therefore, the excitation control circuit 34 also does not output the drive control signal CT to the high frequency inverter circuit 35 in this case.

The high frequency inverter circuit 35 is connected to the primary coil L1 arranged in the coil portion 14a of the coil unit CU. The high frequency inverter circuit 35 oscillates at a predetermined frequency in accordance with the drive control signal CT to excite and drive the primary coil L1.

In detail, the high frequency inverter circuit 35 excites and drives the primary coil L1 when the drive control signal CT for exciting and driving the primary coil L1 is input from the excitation control circuit 34.

Therefore, when the device E that can receive power from the contactless power supplying device 1 (power supplying module M) is set on the setting surface 5 immediately above the coil unit CU, the device authentication signal ID is transmitted from the device E, and a metal piece is not present in the vicinity of the device E, the primary coil L1 is excited and driven by the high frequency inverter circuit 35. In other words, the primary coil L1 is excited and driven to supply the secondary power to the device E from the secondary coil L2 through contactless power supply.

The system control unit 36 arranged in the system unit SU includes a microcomputer. The system control unit 36 is electrically connected to the drive portion 14b of each of the coil units CU through the wires IN formed on the printed wiring substrate 10. The system control unit 36 inputs the device authentication ID, the metal-present signal ST, and the various types of data, which includes the position identification signal for identifying the coil unit CU, from the excitation control circuit 34 of each drive portion 14b.

The system control unit 36 determines whether or not the device E that can be supplied with power and is requesting for power supply is set immediately above the drive portion 14b of the coil unit CU based on the device authentication signal ID from the excitation control circuit 34 of the drive portion 14b.

When the device authentication signal ID is input from the excitation control circuit 34 of the drive portion 14b, the system control unit 36 outputs the permission signal to the excitation control circuit 34 of the drive portion 14b. That is, the system control unit 36 determines that the device E that can be supplied with power and that is requesting for power supply is set immediately above the drive portion 14b, and outputs the permission signal to the excitation control circuit 34 of the drive portion 14b.

If the size of the device E that can be supplied with power and is requesting for power supply is large and set on the setting surface 5 of the contactless power supplying device 1, two or more coil units CU (coil portions 14a) may be positioned immediately underneath.

In this case, the drive portion 14b of each coil unit CU (coil portion 14a) positioned immediately below the device E receives the device authentication signal ID of the device E. Each drive portion 14b then outputs the device authentication signal ID of the device E to the system control unit 36.

The system control unit 36 determines whether or not the device E set immediately above each coil unit CU is the same as the device corresponding to the device authentication signal ID based on the device authentication signal ID including the position identification signal from the drive portion 14b of each coil unit CU.

In this case, if the size of the device E is large, each coil unit CU can be determined from a group of coil units CU that are adjacent to each other and not separated using the position identification signal for identifying each coil unit CU and the device authentication signal ID.

The system control unit 36 then simultaneously outputs the permission signal to the drive portions 14b (excitation control circuits 34) of the plurality of coil units CU, which is a group that is positioned immediately below the mounted device E having a large size and outputting the device authentication signal ID.

Therefore, the plurality of drive portions 14b of the plurality of coil units CU cooperate to excite the plurality of primary coils L1 of the corresponding plurality of coil units CU, and supply power to the one device E having a large size.

Two or more devices E requesting for power supply may be set on the setting surface 5 of the contactless power supplying device 1.

In this case, the drive portion 14b corresponding to the coil unit CU (coil portion 14a) positioned immediately below each device E receives the device authentication signal ID for the corresponding device E and outputs the device authentication signal ID to the system control unit 36.

The system control unit 36 determines whether or not the device E set immediately above each coil unit CU is not one but two or more based on the device authentication signal ID including the position identification signal from the drive portion 14b of each coil unit CU.

In this case, if two or more devices E are mounted, it may be determined that the coil units CU are located at separate positions with the position identification signal and the device authentication signal ID from the drive portion 14b of each coil unit CU.

The system control unit 36 outputs the permission signal to the drive portion 14b for each coil unit CU that is located immediately below the two or more set devices E and that output the device authentication signal ID. Therefore, the drive portion 14b of the coil unit CU corresponding to each device E excites the primary coil L1 of the coil portion 14a, and supplies power to each device E.

The system control unit 36 determines that the metal piece is set immediately above each coil unit CU based on the metal-present signal ST from the drive portion 14b (excitation control circuit 34) of each coil unit CU. When the metal-present signal ST is input from the excitation control circuit 34 of the drive portion 14b to the system control unit 36, the system control unit 36 does not output the permission signal to the excitation control circuit 34 of the drive portion 14b. That is, the system control unit 36 determines that the metal piece is set immediately above the coil unit CU, and does not output the permission signal to the drive portion 14b (excitation control circuit 34) of the coil unit CU.

When various types of data including the position identification signal is input from the drive portion 14b of each coil unit CU to the system control unit 36, the system control unit 36 determines the state of the load Z of the device E set immediately above the coil unit CU and the state of the voltage/current control circuit 22. The system control unit 36 then calculates an amplitude value for exciting the primary coil L1 arranged in the coil portion 14a of the coil unit CU at an optimum amplitude and a frequency value for exciting at an optimum frequency to optimize the state of the load Z of the device E and the state of the voltage/current control circuit 22. The system control unit 36 then outputs the amplitude value and the frequency value to the corresponding drive portion 14b (excitation control circuit 34).

The excitation control circuit 34 outputs the amplitude value and the frequency value calculated by the system control unit 36 to the high frequency inverter circuit 35. The high frequency inverter circuit 35 oscillates based on the amplitude value and the frequency value, and excites and drives the primary coil L1. The device E set immediately above the coil unit CU thus receives the optimum secondary power, and can control the state of the load Z and the state of the voltage/current control circuit 22 to an optimum state.

Manufacturing Method

The manufacturing method of the power supplying module M will now be described.

Manufacturing Method: Stage 1

With regard to the power supplying module M for the contactless power supplying device 1, the size of the power suppliable region AR is set, and the number of coil units CU and the layout of the coil units CU are determined for the set size of the power suppliable region AR. After the number and the layout of coil units CU are determined, the printed wiring substrate 10 having a size that fits the layout is set. Then, with respect to the printed wiring substrate 10 of which the size has been determined, the coil unit fitting recess 11 is formed at a desired position for each coil unit CU, and the system unit fitting recess 12 is formed at a desired position (second arrangement section) for the system unit SU.

The pad PD is formed on the bottom surface of each coil unit fitting recess 11 in accordance with the electrode P of the coil unit CU, and the pad PD is formed on the bottom surface of the system unit fitting recess 12 in accordance with the electrode P of the system unit SU.

With regard to the printed wiring substrate 10, the plurality of wires IN for electrically connecting the system unit SU fitted into the system unit fitting recess 12 and the coil unit CU fitted into each coil unit fitting recess 11 are designed and manufactured.

For such printed wiring substrate 10 formed in advance, the flip-chip coil unit CU is fitted into each coil unit fitting recess 11, and the plurality of pads PD of the printed wiring substrate 10 and the plurality of electrodes P of the coil units CU are respectively joined. In the same manner, the flip-chip system unit SU is fitted into the system unit fitting recess 12, and the plurality of pads PD of the printed wiring substrate 10 and the plurality of electrodes P of the system unit SU are respectively joined.

Thus, a plurality of (18 in the present embodiment) coil units CU are coupled to the printed wiring substrate 10, and the system unit SU for centrally controlling each coil unit CU is coupled to the printed wiring substrate 10. This manufactures the power supplying module M.

The power supplying module M in which the system unit SU and the plurality of coil units CU are coupled to the printed wiring substrate 10 is then accommodated in the box body 3 of the housing 2 and closed by the top plate 4. This completes the contactless power supplying device 1.

Manufacturing Method: Stage 2

First, the printed wiring substrate 10, which includes the system unit fitting recess 12 and the large number of coil unit fitting recesses 11, is formed in advance. In this case, the plurality of pads PD are formed on the bottom surface S2 of the system unit fitting recess 12, and the plurality of pads PD are also formed on the bottom surface S1 of the large number of coil unit fitting recesses 11. Furthermore, the plurality of wires IN for electrically connecting the plurality of pads PD formed on the bottom surface S2 of the system unit fitting recess 12 and the plurality of pads PD formed in the coil unit fitting recesses 11 are formed.

The coil unit fitting recess 11 that is to be used is selected from the large number of coil unit fitting recesses 11 using the printed wiring substrate 10 including the system unit fitting recess 12 and the large number of coil unit fitting recesses 11. That is, for example, the coil unit fitting recesses 11 positioned within the power suppliable region AR, which is set in accordance with the request of the user, are selected.

The flip-chip coil unit CU is fitted into each selected coil unit fitting recess 11 within the desired power suppliable region AR of the user, and the plurality of pads PD of the printed wiring substrate 10 and the plurality of electrodes P of each coil unit CU are respectively joined. In the same manner, the flip-chip system unit SU is fitted into the system unit fitting recess 12, and the plurality of pads PD of the printed wiring substrate 10 and the plurality of electrodes P of the system unit SU are respectively joined.

In the manufacturing method, the necessary coil unit fitting recess 11 is selected in the printed wiring substrate 10 including the large number of coil unit fitting recesses 11. The coil unit CU is coupled to the selected coil unit fitting recess 11. The system unit SU for centrally controlling each coil unit CU is coupled to the printed wiring substrate 10. This manufactures the power supplying module M.

In this case, the large number of coil unit fitting recesses 11 are formed in advance in the printed wiring substrate 10. The necessary coil unit fitting recess 11 is selected, and the coil unit CU is coupled to the selected coil unit fitting recess 11. Thus, the same printed wiring substrate 10 is applicable to various power suppliable regions AR.

The first embodiment has the advantages described below.

(1) The first embodiment uses the plurality of coil units CU including the primary coils L1 of the same specification. The coil unit fitting recesses 11 are formed in the printed wiring substrate 10 in conformance with the plurality of coil units CU. The plurality of pads PD, which are respectively joined with the plurality of electrodes P formed in the coil unit CU, are formed on the bottom surface S1 of each coil unit fitting recess 11.

Therefore, the plurality of coil units CU are easily coupled to the printed wiring substrate 10 by simply fitting and joining each coil unit CU to the corresponding coil unit fitting recess 11. This improves the manufacturing efficiency.

In addition, each coil unit CU has the same specification with respect to material, shape, and size, and the coil units CU of the same specification may be used. Thus, the coil unit CU may be mass-produced. This reduces costs of the coil unit CU.

Moreover, since the coil units CU of the same specification are used, the number of components of the coil unit CU is small, and there are few manufacturing steps. This facilitates component management.

(2) In the first embodiment, the primary coil L1 of each coil unit CU is configured to be wound around the core C, which is formed by a magnetic body. Therefore, the primary coil L1 is miniaturized as compared with an air core coil, and the size of the contactless power supplying device 1 (power supplying module M) is reduced. Furthermore, the miniature primary coil increases the power supplying capacity and improves the power supplying efficiency.

(3) In the first embodiment, the system unit fitting recess 12 is formed in the printed wiring substrate 10. The plurality of pads PD, which are to be joined with the plurality of electrodes P formed on the system unit SU, are formed on the bottom surface S2 of the system unit fitting recess 12. The system unit SU for centrally controlling each coil unit CU is fitted into the system unit fitting recess 12 to join the system unit fitting recess 12 and the system unit SU. Therefore, the system unit SU is easily coupled to the printed wiring substrate 10.

Furthermore, the system unit SU is electrically connected to each coil unit CU through the plurality of wires IN of the printed wiring substrate 10. Thus, the wiring step of the system unit SU and each coil unit CU is significantly simplified, and the manufacturing efficiency of the power supplying module M is improved.

(4) In the first embodiment, the plurality of coil unit fitting recesses 11 and the system unit fitting recess 12 are formed in the printed wiring substrate 10. The plurality of coil units CU and the system unit SU are fitted into the plurality of coil unit fitting recesses 11 and the system unit fitting recess 12. Therefore, the coupling task for arranging the coil unit CU and the system unit SU on the printed wiring substrate 10 is easily and accurately performed.

(5) In the first embodiment, the system unit SU and the plurality of coil units CU are coupled to the printed wiring substrate 10 to manufacture one power supplying module M. The power supplying module M integrates the printed wiring substrate 10, the system unit SU, and the plurality of coil units CU. Thus, a large number of power suppliable power supplying modules M can be simultaneously transported. In addition, the step of accommodating in the box body 3 of the housing 2, which is performed at different location, merely includes accommodating only the power supplying module M in the box body 3. Thus, the operation step of accommodating in the box body 3 of the housing 2 is very simple and completed within a short time.

(6) According to the first embodiment, the large number of coil unit fitting recesses 11 is formed in advance in the printed wiring substrate 10. The necessary coil unit fitting recess 11 is selected in accordance with the power suppliable region AR, and the same coil unit CU is coupled to the selected coil unit fitting recesses 11 to form the power supplying module M. Therefore, the same printed wiring substrate 10 is applicable to various power suppliable regions AR, and the degree of freedom in design for the same printed wiring substrate 10 is increased.

Furthermore, since the plurality of the same coil units CU are coupled, a plurality of the same coil units CU are mass-produced. This lowers the price of the coil unit CU. Moreover, since a plurality of the same coil units CU are coupled, there are no complicated assembling tasks, and the efficiency is achieved.

(7) In the first embodiment, one power suppliable power supplying module M is configured to couple the system unit SU and the plurality of coil units CU to the printed wiring substrate 10. Thus, the mode of the power suppliable power supplying module M, that is, the shape of the printed wiring substrate 10, the number of coil units CU, and the arrangement state of the plurality of coil units CU are simply and easily changed in accordance with the power suppliable region AR.

Furthermore, in the present embodiment, each coil unit CU has a rectangular parallelepiped shape. The power supplying module M having a linear power suppliable region AR can be formed by arranging the plurality of coil units CU in the longitudinal directions along a single line. The power supplying module M having a wide and elongated power suppliable region may be formed by arranging the plurality of coil units CU in the short-side direction along a single line. Therefore, a power supplying module M having the linear power suppliable region AR and a power supplying module M having the wide elongated power suppliable region AR are realized using one type of coil unit CU.

Figure 9:
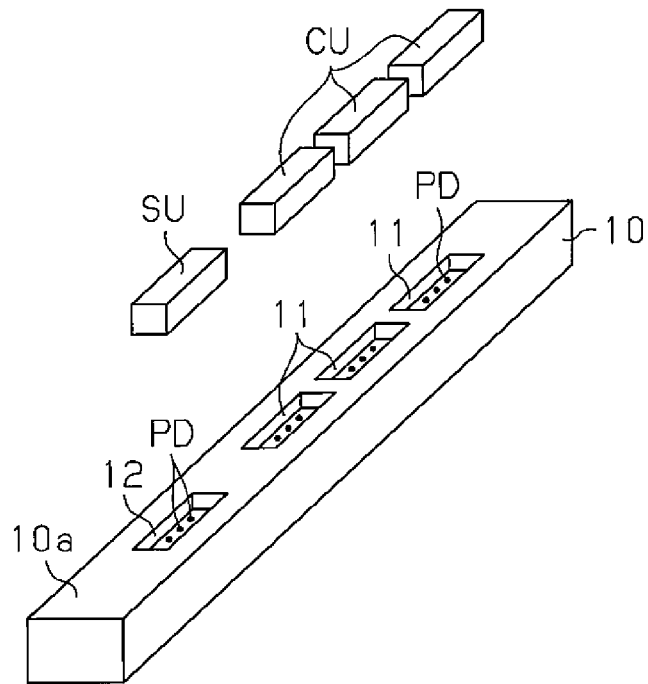
FIG. 9 is an exploded perspective view of a power supplying module showing another example of the first embodiment.
Figure 10:
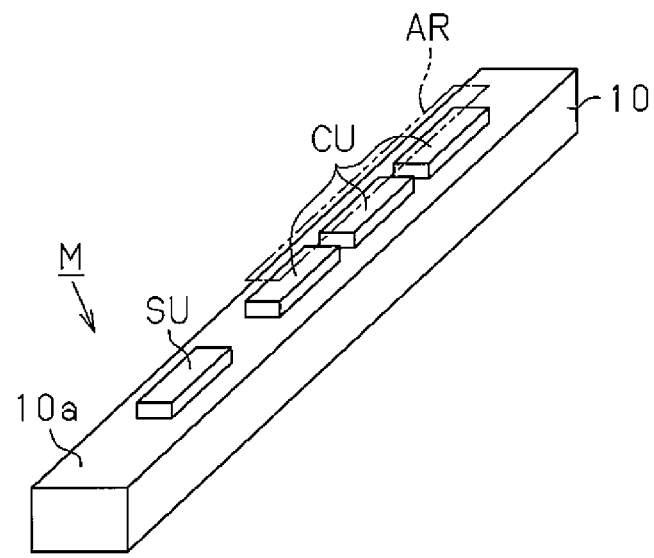
FIG. 10 is an overall perspective view of the power supplying module.

For example, as shown in FIG. 9 and FIG. 10, a plurality of coil unit fitting recesses 11, which extend in the front-back direction and into which the plurality of coil units CU are fitted, and the system unit fitting recess 12, into which the system unit SU is fitted, are formed in the linear printed wiring substrate 10 extending in the front-back direction. The coil unit CU is fitted into each coil unit fitting recess 11 to join the plurality of coil unit fitting recesses 11 and the plurality of coil units CU. The system unit SU is fitted into the system unit fitting recess 12 to join the system unit fitting recess 12 and the system unit SU. This easily forms the power supplying module M having the linear power suppliable region AR extending in the front-back direction.

Figure 11:
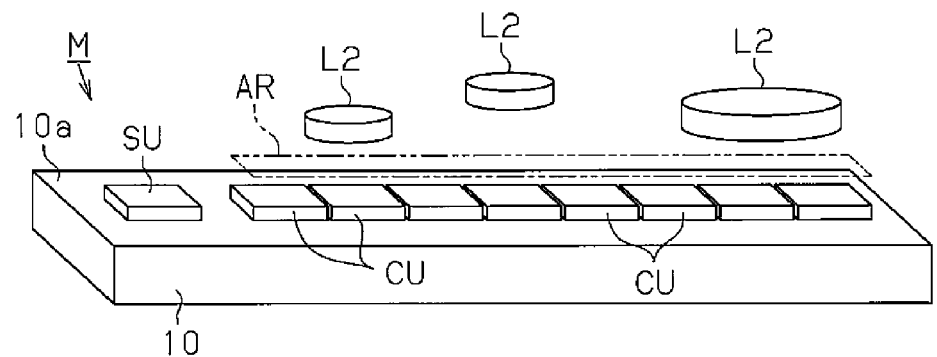
FIG. 11 is an overall perspective view of the power supplying module.

As shown in FIG. 11, a plurality of coil unit fitting recesses 11 and the system unit fitting recess 12 are formed in the linear printed wiring substrate 10 extending in the left-right direction so that the plurality of coil units CU and the system unit SU, which longitudinal directions are directed in the left-right direction, are adjacent to each other. The plurality of coil units CU are fitted into the plurality of coil unit fitting recesses 11 formed in the linear printed wiring substrate 10 to join the plurality of coil unit fitting recesses 11 and the plurality of coil units CU. The system unit SU is fitted into the system unit fitting recess 12 to join the system unit fitting recess 12 and the system unit SU. This easily manufactures the power supplying module M having the linear power suppliable region AR extending in the left-right direction and in which two coil units CU are adjacent to each other.

Figure 12:
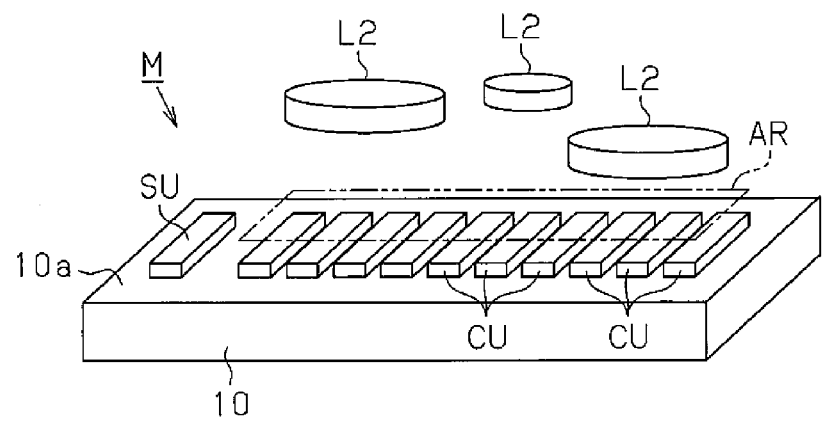
FIG. 12 is an overall perspective view of the power supplying module.

As shown in FIG. 12, the plurality of coil units CU and the system unit SU are arranged together in the left-right direction on the linear printed wiring substrate 10 extending in the left-right direction so that the plurality of coil units CU and the system unit SU, of which the longitudinal directions are opposed in the front-back direction, are adjacent to each other. This allows for easy manufacturing of the power supplying module M including the linear power suppliable region AR arranged in the left-right direction so that the plurality of coil units CU and the system unit SU, of which the longitudinal directions are opposed in the front-back direction, are adjacent to each other.

Figure 13:
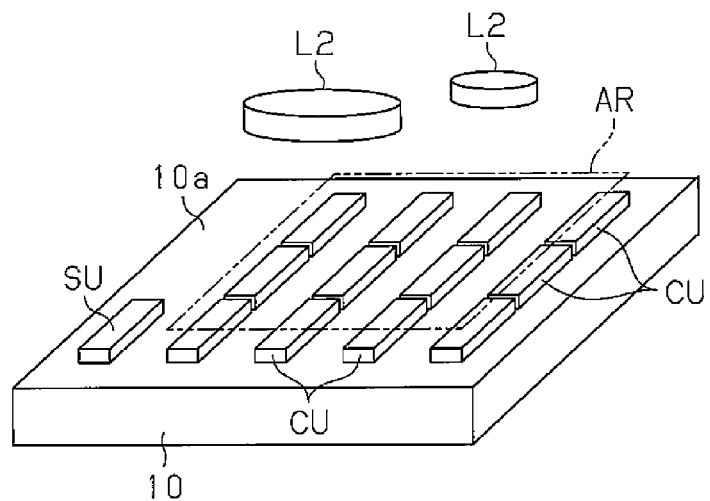
FIG. 13 is an overall perspective view of the power supplying module.

Furthermore, as shown in FIG. 13, the plurality of coil units CU are arranged in parallel on the planar printed wiring substrate 10 extending in the front-back and left-right directions so that the plurality of coil units CU adjacent to each other in the front-back direction are also adjacent to each other in the left-right direction. This allows for easy manufacturing of the power supplying module M having the planar power suppliable region AR in which the plurality of coil units CU adjacent to each other in the front-back direction are adjacent to each other.

The first embodiment may be performed as described below.

Figure 14:
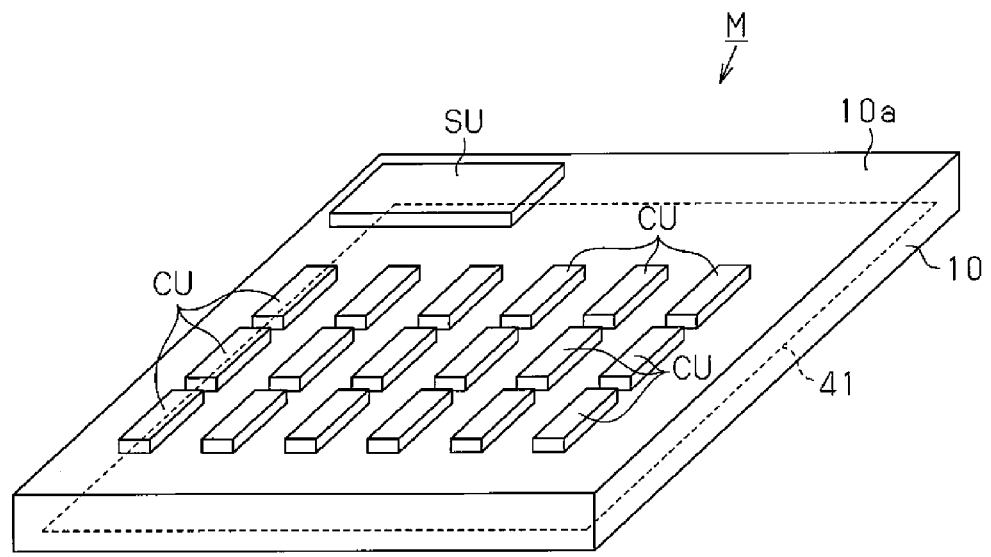
FIG. 14 is an overall perspective view of the power supplying module.

As shown in FIG. 14, a magnetic sheet 41 serving as the magnetic member made of magnetic material for electromagnetic shield may be arranged on the lower surface of the printed wiring substrate 10 of the power supplying module M. A magnetic body film may be formed between layers in the printed wiring substrate 10 of the multi-layered printed wiring substrate.

Thus, noise can be prevented without increasing the size of the power supplying module M (printed wiring substrate 10).

Figure 15:
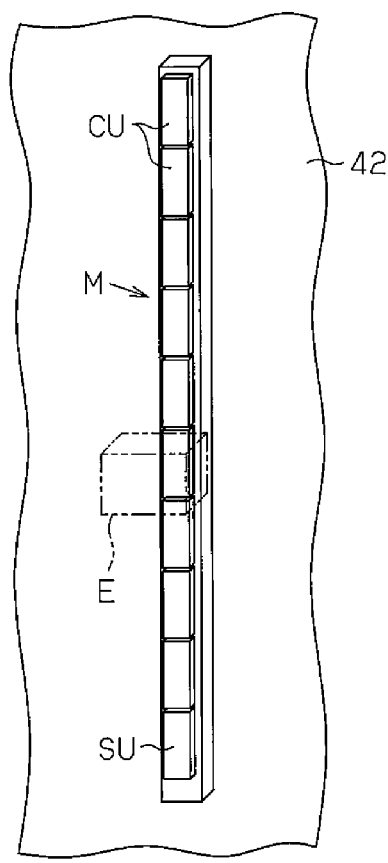
FIG. 15 is an overall perspective view of the power supplying module.
Figure 16:
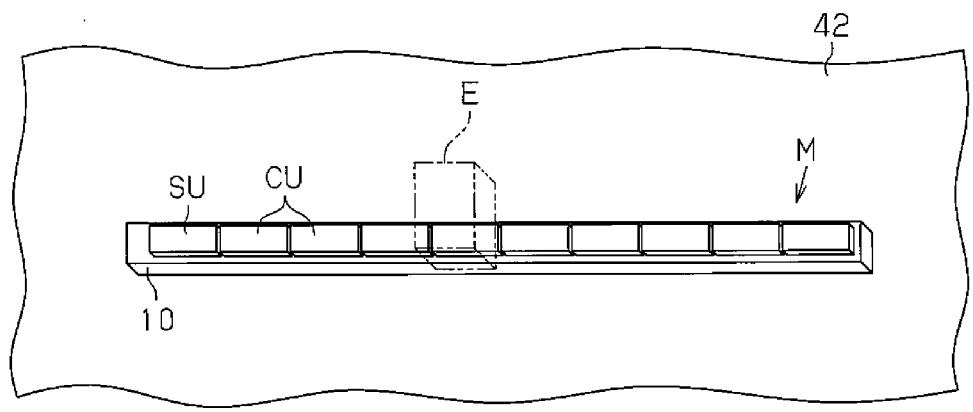
FIG. 16 is an overall perspective view of the power supplying module.

As shown in FIG. 15, the power supplying module M having the linear power suppliable region AR shown in FIG. 11 is arranged vertically. The power supplying module M may, for example, be arranged along a wall 42 in this state. In the same manner, as shown in FIG. 16, the power supplying module M having the linear power suppliable region AR shown in FIG. 11 is arranged horizontally. The power supplying module M may, for example, be arranged along the wall 42 in this horizontal state.

Figure 17:
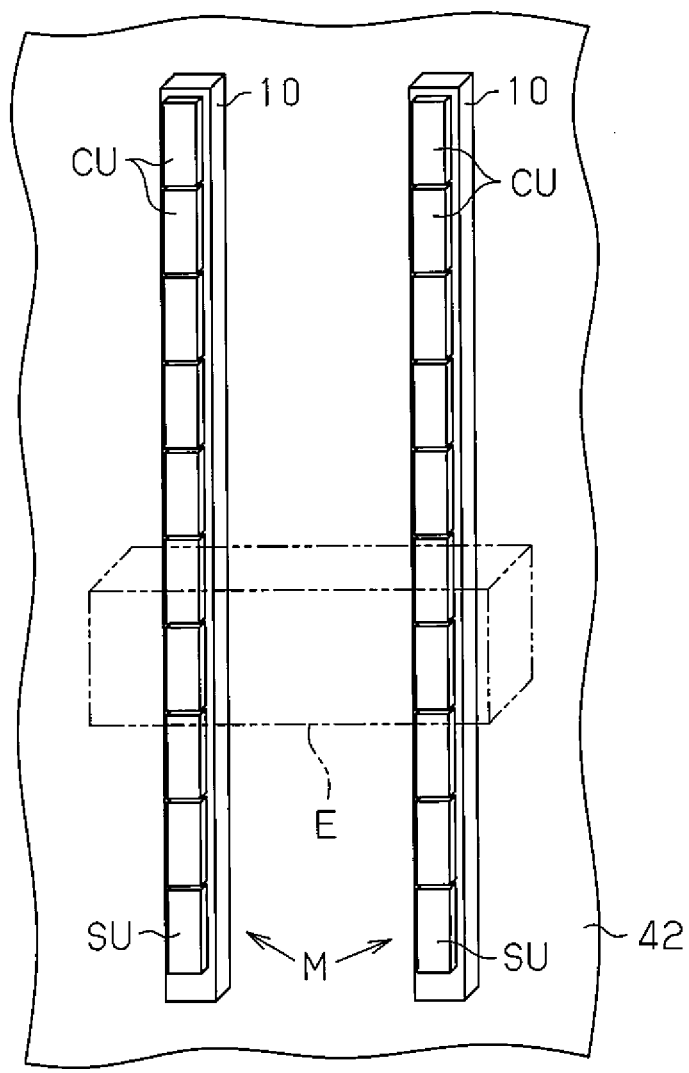
FIG. 17 is an overall perspective view of the power supplying module.

Furthermore, as shown in FIG. 17, a plurality of (two in FIG. 17) power supplying modules M having the linear power suppliable region AR are arranged in parallel in the vertical direction. For example, the plurality of power supplying modules M may be arranged along the wall 42. In this case, the device E can receive power supply from the plurality of power supplying modules M, and thus can receive a large power.

In these cases, the power supplying modules M may be directly arranged on the wall 42, or the power supplying modules M may be installed while being accommodated in the housing 2. The power supplying modules M may be arranged on the wall 42.

Figure 18:
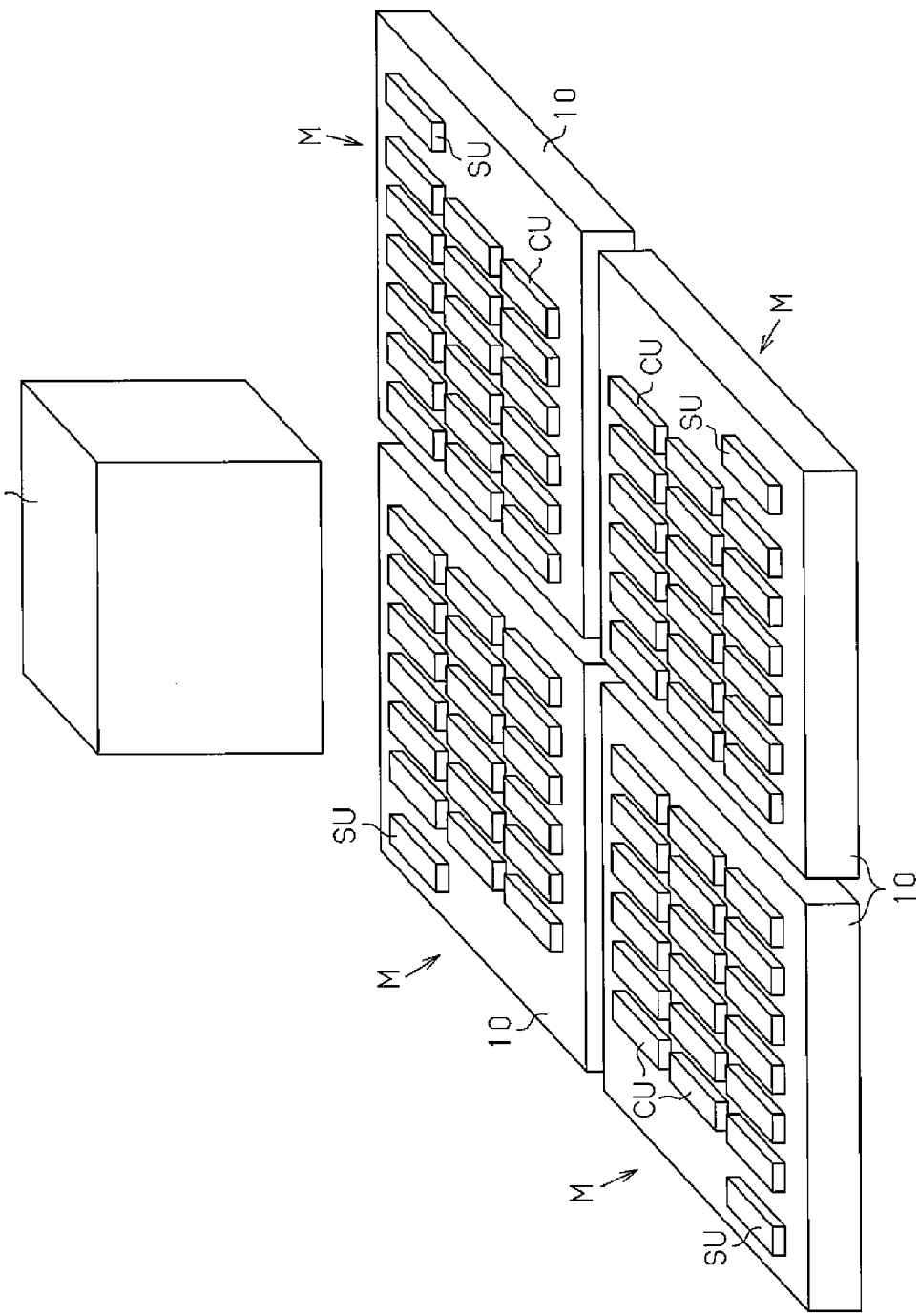
FIG. 18 is an overall perspective view of the power supplying module.

As shown in FIG. 18, the plurality of (four in FIG. 15) power suppliable power supplying modules M of the first embodiment may be adjacently arranged in the front-back and left-right directions. In this case, power can be supplied from the plurality of power supplying modules M to one device E. The device E thus can receive a large power.

Figure 19:
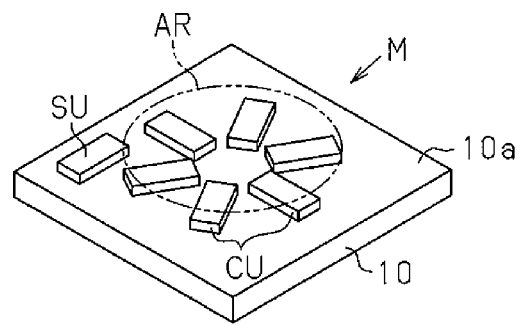
FIG. 19 is an overall perspective view of the power supplying module.

As shown in FIG. 19, the power supplying module M in which the plurality of coil units CU are arranged on the printed wiring substrate 10 at equal angular intervals in the circumferential direction with the arrangement angle of the plurality of coil units CU changed may be formed. In this case, a circular power suppliable region AR can be formed. The power supplying module M including the spread power suppliable region AR can thus be provided. The power supplying module M in which the plurality of coil units CU are arranged in a fan-shape with respect to the printed wiring substrate 10 may be formed. In this case, the sector-shaped power suppliable region can be formed. The power supplying module M including the spread power suppliable region AR thus can be provided. For example, by arranging or embedding the sector-shaped or circular power supplying module M on or in a table, the power can be supplied by simply placing the device E at a place set as the power suppliable region of the table.

Figure 20:
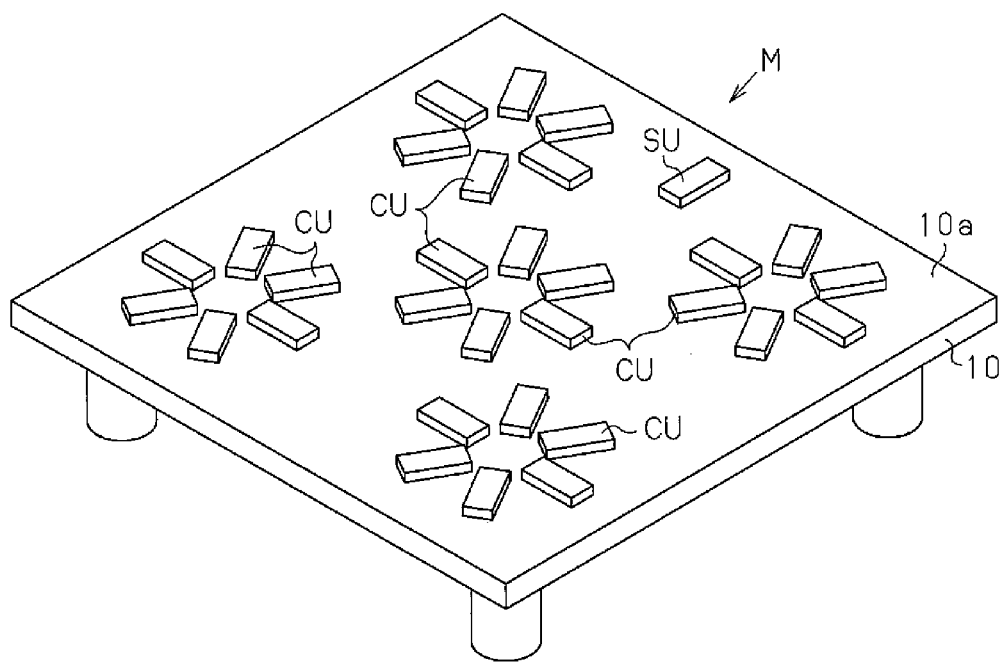
FIG. 20 is an overall perspective view of the power supplying module.

As shown in FIG. 20, the power supplying module M in which the plurality of coil units CU arranged at an equiangular interval in the circumferential direction are arranged in plurals with respect to the printed wiring substrate 10 of large size may be formed. In this case, a plurality of power suppliable regions AR can be formed.

As shown in FIGS. 21(a), and 21(b) (the drawings do not show the printed wiring substrate 10), the power supplying module M having the linear power suppliable region AR as shown in FIG. 15 may be combined three-dimensionally in the vertical direction so that a plurality of (four in the figure) printed wiring substrates 10 face the inner side. For example, as shown in FIG. 21(b), the three-dimensional contactless power supplying device including the plurality of power supplying modules M may be arranged or embedded on or in a circular column-shaped column 44. This enables power supply at the surface of the column 44.

Figure 22A:
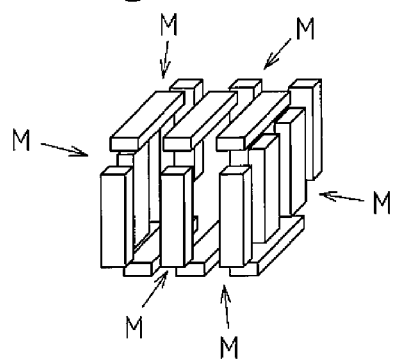
FIG. 22(a) is a diagram showing the arrangement of the plurality of power supplying modules.
Figure 22B:
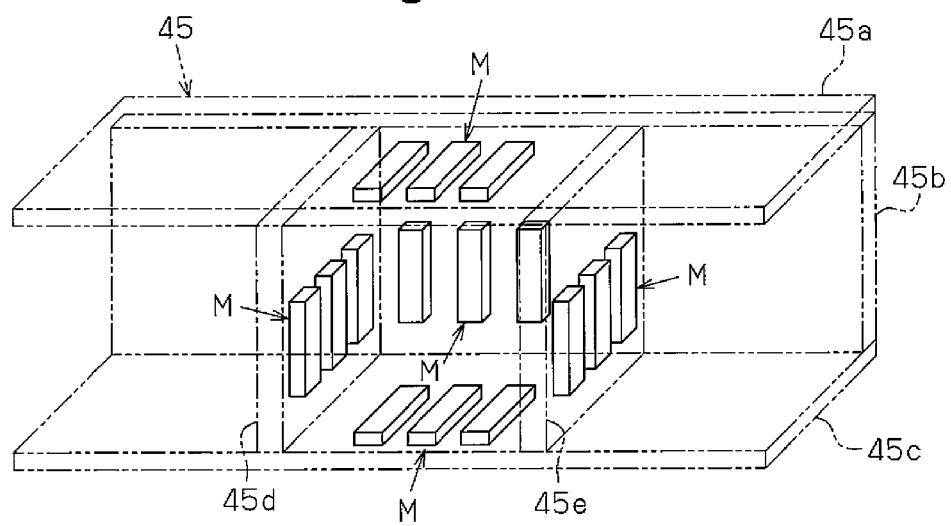
FIG. 22(b) is a diagram showing the plurality of power supplying modules arranged in a box.

As described above, the power supplying module M shown in FIG. 12 is configured to arrange together the plurality of coil units CU and the system unit SU, of which longitudinal directions are opposed in the front-back direction, in the left-right direction to be adjacent to each other on the printed wiring substrate 10 extending in the left-right direction. As shown in FIGS. 22(a) and 22(b) (the drawings do not show the printed wiring substrate 10), the power supplying module M may be three-dimensionally combined into a box-shape so that the plurality of (four in the drawing) printed wiring substrates 10 face the outer side.

The three-dimensional (box-shaped) contactless power supplying device including a plurality of power supplying modules M may, for example, be arranged on plates 45a to 45e configuring an accommodation box 45 or inside the plates 45a to 45e, as shown in FIG. 22(b). This enables power supply in the accommodation box 45.

Each coil unit CU has the same specification, and the primary coil L1 of the coil portion 14a of each coil unit CU also has the same specification. However, for example, only the number of windings of the primary coil L1 may be changed without changing the outer shape of each coil unit CU.

The interval between the coil units CU may be appropriately changed to change the average magnetic flux density in accordance with the power supplying capacity for supplying power.

An insulator having a thickness may be arranged on the plurality of coil units CU arranged on the printed wiring substrate 10. The suppliable power to the device E can be set by changing the thickness of the insulator. That is, the receiving power and the receiving voltage can be changed even in the contactless power supplying device having the same supplying power performance when the distance between the contactless power supplying device (power supplying module M) and the device E is changed by interposing the insulator. Thus, power can be supplied to various devices E.

Apparently, one insulator may be arranged on all of the upper surfaces of the plurality of coil units CU arranged on the printed wiring substrate 10.

Figure 23:
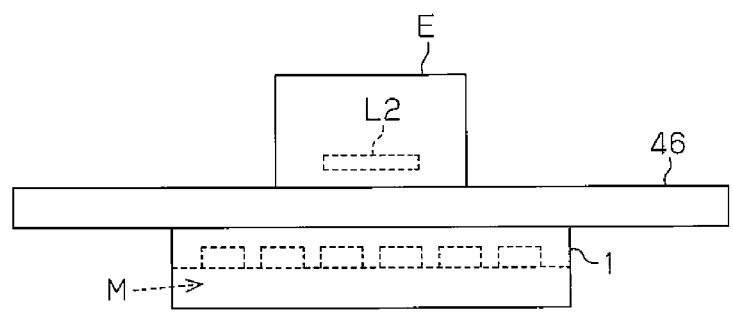
FIG. 23 is a view in which the power supplying module is arranged under a floor.

When the power supplying module M is used accommodated in the housing 2, the thickness of the top plate 4 may be changed. As shown in FIG. 23, when the contactless power supplying device (power supplying module M) is arranged under a floor plate 46, the suppliable power to the device E can be set by setting the interval between the floor plate 46 and the contactless power supplying device 1 (power supplying module M).

In the first embodiment, the depth of the plurality of coil unit fitting recesses 11 and the system unit fitting recess 12 is the depth at which the plurality of coil units CU and the system unit SU project from the upper surface 10a. However, the depth may be the depth at which the upper surfaces of the plurality of coil units CU and the system unit SU are flush with the upper surface 10a of the printed wiring substrate 10, or the emerging depth.

In the first embodiment, the plurality of coil unit fitting recesses 11 and the system unit fitting recess 12 are formed, the coil unit CU is fitted into each coil unit fitting recess 11, and the system unit SU is fitted into the system unit fitting recess 12. However, the coil unit fitting recess 11 and the system unit fitting recess 12 may be omitted.

In the first embodiment, the system unit SU is coupled to the printed wiring substrate 10 for the power supplying module M. However, the power supplying module M may be configured such that the system unit SU is omitted and the plurality of coil units CU are coupled to the printed wiring substrate 10.

In the first embodiment, the drive portion 14b of the coil unit CU includes the device authentication reception circuit 31, the metal detection circuit 32, the data transmission/reception circuit 33, the excitation control circuit 34, and the high frequency inverter circuit 35. There is no such limitation, and the drive portion 14b of the coil unit CU may include the device authentication reception circuit 31, the metal detection circuit 32, the data transmission/reception circuit 33, and the excitation control circuit 34, excluding the high frequency inverter circuit 35. The drive portion 14b of the coil unit CU may have all components omitted, or at least one omitted from the configuration of the first embodiment. If all are omitted, the detection of the device E is detected with another means, and the system control unit 36 drive controls the high frequency inverter circuit 35 based on such detection.

Second Embodiment

A second embodiment of the present invention will now be described.

The coil unit CU of the first embodiment is configured by the coil portion 14a and the drive portion 14b. In contrast, the coil unit of the second embodiment has the drive portion 14b omitted from the coil unit CU of the first embodiment.

Figure 24:
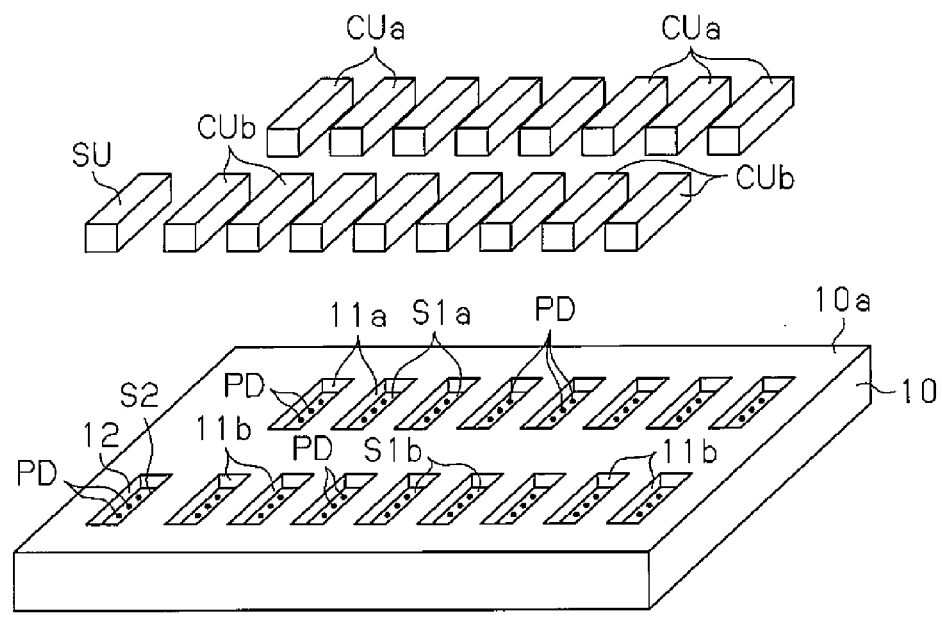
FIG. 24 is an exploded perspective view of a power supplying module of a second embodiment.

As shown in FIG. 24, eight coil unit fitting recesses 11a are formed in the left-right direction at the back side of the upper surface 10a of the printed wiring substrate 10. Eight drive unit fitting recesses 11b and one system unit fitting recess 12 are formed in the left-right direction on the front side of the upper surface 10a of the printed wiring substrate 10.

Each coil unit fitting recess 11a has a rectangular shape extending in the front-back direction. The coil unit fitting recesses 11a are formed at equal pitches from the adjacent coil unit fitting recess 11a in the left-right direction. Each drive unit fitting recess 11b has a rectangular shape extending in the front-back direction, and is formed in juxtaposition with each coil unit fitting recess 11a formed on the back side of the upper surface 10a. The system unit fitting recess 12 is adjacently formed on the left side of the plurality of drive unit fitting recesses 11b.

A coil unit CUa is fitted into each coil unit fitting recess 11a. A drive unit CUb is fitted into each drive unit fitting recess 11b. The system unit SU is fitted into the system unit fitting recess 12.

Each coil unit CUa of the second embodiment includes the coil portion 14a having a cuboid shape in which the drive portion 14b of the coil unit CU shown in the first embodiment is omitted. That is, each coil unit CUa of the second embodiment includes the coil portion 14a of the first embodiment shown in FIG. 4 and FIG. 5, and is molded from the insulating resin 13. On the lower surface of each coil unit CUa, the electrodes P of a plurality of external input/output terminals are electrically connected respectively with the drive unit CUb through the plurality of wires IN formed on the printed wiring substrate 10.

Each coil unit CUa is formed with the same specification in terms of material, shape, and size.

Each drive unit CUb includes the drive portion 14b in which the coil portion 14a of the coil unit CU shown in the first embodiment is omitted. That is, the drive unit CUb of the second embodiment includes the coil portion 14a of the first embodiment shown in FIG. 4, and is molded from the insulating resin 13. On the lower surface of each drive unit CUb is formed the electrodes P of a plurality of external input/output terminals to be electrically connected respectively with the coil unit CUa and the system unit SU through the plurality of wires IN formed on the printed wiring substrate 10.

Each drive unit CUb is formed with the same specification in terms of material, shape, and size.

Each drive unit CUb is electrically connected with the coil unit CUa. Each drive unit CUb excites and drives the primary coil L1 of the coil unit CUa. Furthermore, each drive unit CUb inputs the reception signal received by the signal reception antenna AT1 arranged in the coil unit CUa and the metal-present signal ST received by the metal detection antenna AT2.

The system unit SU includes the system control unit 36, which includes the microcomputer for centrally controlling each drive unit CUb, the power supply circuit, and the like, similar to the first embodiment. The lower surface of the system unit SU includes the electrodes P of a plurality of external input/output terminals electrically connected with the drive unit CUb through the plurality of wires IN formed on the printed wiring substrate 10, respectively.

A plurality of pads PD, each of which is electrically connected to the electrodes P of the plurality of external input/output terminals of the coil unit CUa fitted into the coil unit fitting recess 11a, are formed on a bottom surface S1a of each coil unit fitting recess 11a of the printed wiring substrate 10. A plurality of pads PD, each of which is electrically connected to the electrodes P of the plurality of external input/output terminals of the drive unit CUb fitted into the drive unit fitting recess 11b, are formed on a bottom surface S1b of each drive unit fitting recess 11b of the printed wiring substrate 10.

A plurality of pads PD, each of which is electrically connected to the electrodes P of the plurality of external input/output terminals of the system unit SU fitted into the system unit fitting recess 12, are formed on a bottom surface S2 of the system unit fitting recess 12 of the printed wiring substrate 10.

Figure 25:
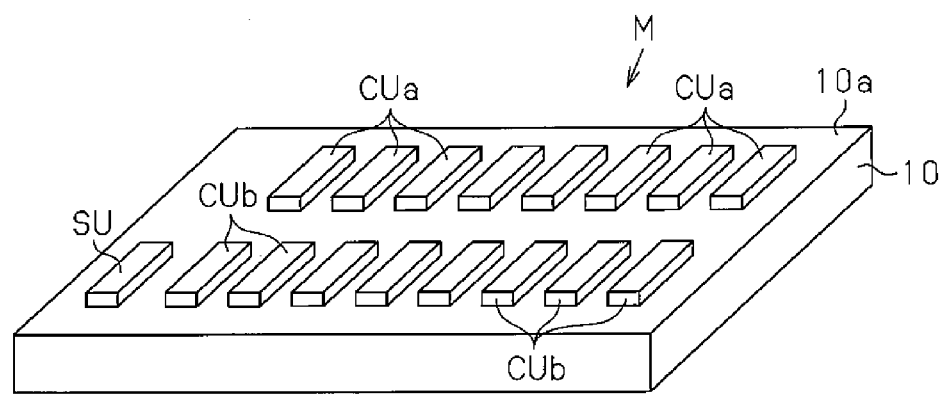
FIG. 25 is an overall perspective view of the power supplying module.

As shown in FIG. 25, the coil unit CUa is fitted into the coil unit fitting recess 11a. The drive unit CUb is fitted into each drive unit fitting recess 11b. This joins the corresponding electrode P and the pad PD. Therefore, the coil unit CUa and the drive unit CUb extending in the front-back direction are electrically connected through the plurality of wires IN formed on the printed wiring substrate 10.

The system unit SU is fitted into the system unit fitting recess 12. The system unit SU and each drive unit CUb are electrically connected through the plurality of wires IN formed on the printed wiring substrate 10 by joining the electrode P and the pad PD.

Manufacturing Method

The manufacturing method of the power supplying module M configured as above will now be described.

Manufacturing Method: Stage 1

With regard to the power supplying module M, the size of the power suppliable region AR is set. The number of coil units CUa, the number of drive units CUb, and the layout of the coil units CUa and the drive units CUb are determined for the set size of the power suppliable region AR. After the numbers and the layout of the coil units CUa and the drive units CUb are determined, the printed wiring substrate 10 having a size that fits the layout is set.

Then, with respect to the printed wiring substrate 10 in which the size is determined, the coil unit fitting recess 11a and the drive unit fitting recess 11b are formed at positions to arrange each coil unit CUa and each drive unit Cub as desired, and the system unit fitting recess 12 is formed at a position to arrange the system unit SU as desired.

The plurality of pads PD are formed on the bottom surfaces S1a, S1b of each coil unit fitting recess 11a and each drive unit fitting recess 11b in accordance with the plurality of electrodes P of the coil unit CUa and the drive unit CUb, and the plurality of pads PD are formed on the bottom surface of the system unit fitting recess 12 in accordance with the plurality of electrodes P of the system unit SU.

Then, with regard to the printed wiring substrate 10, the plurality of wires IN for electrically connecting the coil unit CUa fitted into each coil unit fitting recess 11a and the drive unit CUb fitted into each drive unit fitting recess 11b are designed and manufactured. The plurality of wires IN for electrically connecting the fitted system unit SU of the system unit fitting recess 12 and the drive unit CUb fitted into each drive unit fitting recess 11b are designed and manufactured.

With respect to the printed wiring substrate 10 formed in advance, the flip-chip coil unit CUa is fitted into each coil unit fitting recess 11a, and the plurality of pads PD of the printed wiring substrate 10 and the plurality of electrodes P of each coil unit CUa are respectively joined. In the same manner, the flip-chip drive unit CUb is fitted into each drive unit fitting recess 11b, and the plurality of pads PD of the printed wiring substrate 10 and the plurality of electrodes P of each drive unit CUb are respectively joined. Furthermore, the flip-chip system unit SU is fitted into the system unit fitting recess 12, and the plurality of pads PD of the printed wiring substrate 10 and the plurality of electrodes P of the system unit SU are respectively joined.

According to such manufacturing method, the plurality of coil units CUa and the plurality of drive units CUb are coupled to the printed wiring substrate 10. The system unit SU for centrally controlling each drive unit CUb (coil unit CUa) is coupled to the printed wiring substrate 10. This manufactures the power supplying module M.

Manufacturing Method: Stage 2

First, the printed wiring substrate 10, which includes the system unit fitting recess 12, a large number of coil unit fitting recesses 11a, and a large number of drive unit fitting recesses 11b, is formed in advance. In this case, the plurality of pads PD are formed on the bottom surface S2 of the system unit fitting recess 12, and the plurality of pads PD are also formed on the bottom surface S1a, S1b of the large number of coil unit fitting recesses 11a and the large number of drive unit fitting recesses 11b. Furthermore, the plurality of wires IN for electrically connecting the plurality of pads PD formed on the bottom surface S2 of the system unit fitting recess 12 and the plurality of pads PD formed in each drive unit fitting recesses 11b are formed. Additionally, the plurality of wires IN for electrically connecting the plurality of pads PD formed on the bottom surface S1a of each coil unit fitting recesses 11a and the plurality of pads PD formed on the corresponding drive unit fitting recesses 11b are also formed.

The coil unit fitting recess 11a that is to be used is selected from the large number of coil unit fitting recesses 11 using the printed wiring substrate 10 that includes the system unit fitting recess 12, the large number of coil unit fitting recesses 11a, and the large number of drive unit fitting recesses 11b. That is, for example, the coil unit fitting recess 11a positioned within the power suppliable region AR set in accordance with the request of the user is selected.

The flip-chip coil unit CUa is fitted into each selected coil unit fitting recess 11a within the desired power suppliable region AR of the user. The plurality of pads PD of the printed wiring substrate 10 and the plurality of electrodes P of each coil unit CU are respectively joined. Furthermore, at this time, the flip-chip drive unit CUb corresponding to the coil unit CUa is fitted into the corresponding drive unit fitting recess 11b. The plurality of pads PD of the printed wiring substrate 10 and the plurality of electrodes P of each drive unit CUb are respectively joined. In the same manner, the flip-chip system unit SU is fitted into the system unit fitting recess 12. The plurality of pads PD of the printed wiring substrate 10 and the plurality of electrodes P of the system unit SU are respectively joined.

According to such manufacturing method, the necessary coil unit fitting recess 11a and the drive unit fitting recess 11b are selected in the printed wiring substrate 10 including the large number of coil unit fitting recesses 11a and the large number of drive unit fitting recesses 11b. The coil unit CUa is coupled to the selected coil unit fitting recess 11a. The drive unit CUb is coupled to the selected drive unit fitting recess 11b. The system unit SU for centrally controlling each coil unit CUa is coupled to the printed wiring substrate 10. This manufactures the power supplying module M.

In this case, the large number of coil unit fitting recesses 11a and the large number of drive unit fitting recesses 11b are formed in the printed wiring substrate 10. The necessary coil unit fitting recess 11a and the drive unit fitting recess 11b are selected, and the coil unit CUa and the drive unit CUb are simply coupled to the selected coil unit fitting recess 11a and the drive unit fitting recess 11b. Thus, the single printed wiring substrate 10 is applicable to various power suppliable regions AR.

The second embodiment has the advantages described below.

(1) In the second embodiment, the plurality of coil units CUa include the plurality of primary coils L1 having the same specification in terms of material, shape, and size. The plurality of drive units CUb has the same specification in terms of material, shape, and size. Each coil unit fitting recess 11a is formed in the printed wiring substrate 10, and each drive unit fitting recess 11b is formed in the printed wiring substrate 10 arranged in accordance with the drive unit CUb for exciting and driving the coil unit CUa.

The plurality of pads PD joined with the plurality of electrodes P formed in the coil unit CUa and the drive unit CUb are formed on the bottom surfaces S1a, S1b of each coil unit fitting recess 11a and each drive unit fitting recess 11b.

Therefore, the coil units CUa are easily coupled to the printed wiring substrate 10 by simply fitting and joining each coil unit CUa to the corresponding coil unit fitting recess 11a. This improves the manufacturing efficiency of the contactless power supplying device 1.

In the same manner, the drive unit CUb for each coil unit CUa is easily coupled to the printed wiring substrate 10 by simply fitting and joining each drive unit CUb to the drive unit fitting recess 11b. This improves the manufacturing efficiency of the contactless power supplying device 1.

Furthermore, the plurality of coil units CUa and the plurality of drive units CUb are electrically connected by the plurality of wires IN of the printed wiring substrate 10. Thus, the wiring step of each coil unit CUa and each drive unit CUb is extremely simplified, and the manufacturing efficiency of the contactless power supplying device 1 is improved.

Moreover, the plurality of coil units CUa and the plurality of drive units CUb have the same specification. Thus, the plurality of coil units CUa and the plurality of drive units CUb are mass-produced, and the price of the coil unit CUa and the drive unit CUb is lowered.

Additionally, since the plurality of coil units CUa have the same specification and the plurality of drive units CUb also have the same specification, the number of components is small, and there are few manufacturing steps. This facilitates component management.

(2) In the second embodiment, the primary coil L1 of each coil unit CUa is wound around the core C made of a magnetic body in the same manner as the first embodiment. Therefore, the primary coil L1 is miniaturized in comparison with an air core coil. As a result, the size of the contactless power supplying device 1 (power supplying module M) is reduced. Furthermore, the power supplying capacity is increased and the power supplying efficiency is improved with the plurality of primary coils of the same size.

(3) In the second embodiment, the system unit fitting recess 12 is formed in the printed wiring substrate 10. The system unit SU is easily coupled to the printed wiring substrate 10 by simply fitting and joining the system unit SU, which includes the system control unit 36 for centrally controlling each drive unit CUb, into the system unit fitting recess 12.

Furthermore, the system unit SU and each drive unit CUb are electrically connected through the plurality of wires IN of the printed wiring substrate 10. Thus, the wiring step of the system unit SU and each drive unit CUb is extremely simplified, and the manufacturing efficiency of the contactless power supplying device 1 is improved.

(4) In the second embodiment, the plurality of coil unit fitting recesses 11a, the plurality of drive unit fitting recesses 11b, and the single system unit fitting recess 12 are formed in the printed wiring substrate 10. The coil unit CUa, the drive unit CUb, and the system unit SU are fitted into the fitting recesses 11a, 11b, and 12. Therefore, the coupling task of positioning and arranging the plurality of coil units CUa, the plurality of drive units CUb, and the single system unit SU on the printed wiring substrate 10 is easily and accurately performed.

(5) In the second embodiment, the system unit SU, the plurality of coil units CUa, and the plurality of drive units CUb are coupled to the printed wiring substrate 10 to manufacture one power supplying module M. Therefore, the power supplying module M integrates the printed wiring substrate 10, the system unit SU, the plurality of coil units CUa, and the plurality of drive units CUb. This allows a large number of power suppliable power supplying modules M to all be transported at the same time. Furthermore, the step of accommodating in the box body 3 of the housing 2, which is performed at a different location, merely includes accommodating only the power supplying module M in the box body 3. Thus, the operation step is extremely simple and completed in a short time.

(6) In the embodiment, the large number of coil unit fitting recesses 11a and the large number of drive unit fitting recesses 11b are formed in the printed wiring substrate 10 in advance, and the necessary coil unit fitting recesses 11a and the large number of drive unit fitting recesses 11b are selected in accordance with the power suppliable region AR. The coil unit CUa and the drive unit CUb are coupled to the selected coil unit fitting recess 11a and the drive unit fitting recess 11b to form the power supplying module M. Therefore, the single printed wiring substrate 10 is applicable to various power suppliable regions AR, and the degree of freedom in design with one printed wiring substrate is increased.

Furthermore, since the plurality of coil units CUa have the same specification and the plurality of drive units CUb have the same specification, the plurality of the coil units CUa and the plurality of drive units CUb are mass-produced. This lowers the price of the coil unit CU. Furthermore, since the plurality of coil units CU having the same specification are coupled, the coupling task is not complicated, and the efficiency is improved.

(7) In the second embodiment, a single power suppliable power supplying module M is configured to couple the system unit SU, the plurality of coil units CUa, and the plurality of drive units CUb to the printed wiring substrate 10. Thus, the mode of the power supplying module M, that is, the shape of the printed wiring substrate 10, the number of coil units CUa and drive units CUb, and the arrangement state of the plurality of coil units CUa and the plurality of drive units CUb are simply and easily changed in accordance with the power suppliable region AR.

Furthermore, the plurality of coil units CUa have a rectangular parallelepiped shape, and the power supplying module M having a linear power suppliable region can be formed by arranging the longitudinal sides along a line. The power supplying module M having a wide, elongated, and planar power suppliable region can be formed by arranging the plurality of coil units CUa such that the short sides of the plurality of coil units CUa are arranged along a line. Therefore, the power supplying module M of both power suppliable regions AR is achieved with one type of coil unit CUa.

Accordingly, the power supplying module M of various modes similar to those described in the first embodiment can be manufactured from the printed wiring substrate 10, the system unit SU, the plurality of coil units CUa, and the plurality of drive units CUb.

(8) In the second embodiment, with regard to the coil unit CUa, the portion corresponding to the coil portion 14a of the coil unit CU of the first embodiment is changed to the coil unit CUa. This differs from the coil unit CU including the coil portion 14a and the drive portion 14b in the first embodiment. The portion corresponding to the coil portion 14a of the coil unit CU of the first embodiment is changed to the drive unit CUb.

That is, in the present embodiment, the coil portion 14a and the drive portion 14b are separated and each formed as units, whereas the coil portion 14a and the drive portion 14b of the coil unit CU are integrated in the first embodiment.

Therefore, as shown in FIGS. 26(a), 26(b), and 26(c), each coil unit CUa can be excited and driven in various modes.

FIG. 26(a) shows a mode in which one drive unit CUb is excited and driven with respect to one coil unit CUa. FIG. 26(b) shows a mode in which the plurality of coil units CUa are connected in series, and one drive unit CUb is excited and driven for the plurality of coil units CUa connected in series. FIG. 26(c) shows a mode in which the plurality of coil units CUa are connected in parallel to one drive unit CUb, and one drive unit CUb is excited and driven for the plurality of coil units CUa connected in parallel.

The second embodiment may be performed as described below.

As shown in FIG. 27, a capacitor 48 that resonates with the primary coil L1 may be connected in series to the primary coil L1 of each coil unit CUa, and a capacitor 49 that resonates with the secondary coil L2 may be connected in parallel to the secondary coil L2 of the device E. Thus, the impedance becomes small, the input/output current can be increased, the coil terminal voltage can be greatly increased using the parallel resonance, and the receivable power and voltage can be increased. As a result, the efficiency is improved, and the power supplying distance and the power supplying area also increase.

A capacitor that resonates with the primary coil L1 may be connected in parallel to each primary coil L1, or a capacitor that resonates with the secondary coil L2 may be connected in series to the secondary coil L2.

Such resonance capacitors may apparently be applied to the power supplying module M of the first embodiment.

The interval between the coil units CUa may be appropriately changed to change the average magnetic flux density in accordance with the power supplying capacity to supply power.

In the second embodiment, the magnetic sheet 41 serving as the magnetic member made of magnetic material for electromagnetic shielding may be arranged on the lower surface of the printed wiring substrate 10 of the power supplying module M described in another example of the first embodiment, or a magnetic body film may be formed between layers.

Figure 28:
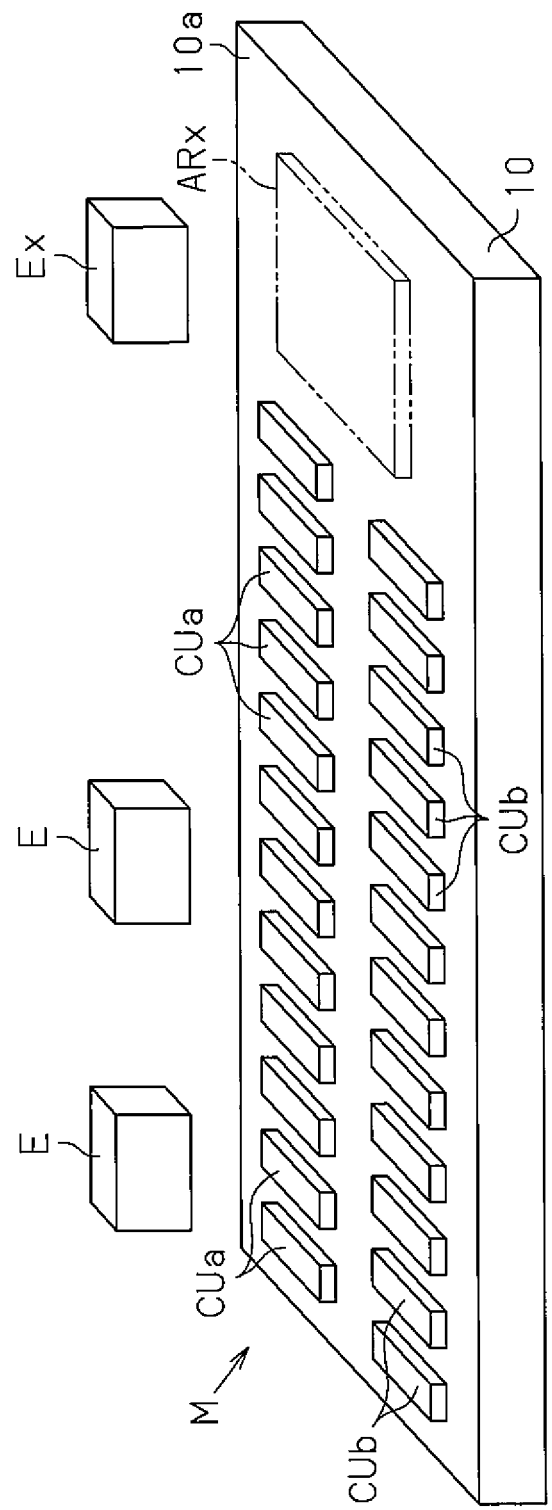
FIG. 28 is an overall perspective view of a power supplying module capable of performing supplying power to a device of another standardized specification.

As shown in FIG. 28, the power supplying module M may include a power suppliable region ARx where the device Ex of another standardized specification can be supplied with power on one side (right side in the figure) of the printed wiring substrate 10, so that the device Ex of another standardized specification can be supplied with power.

Figure 29:
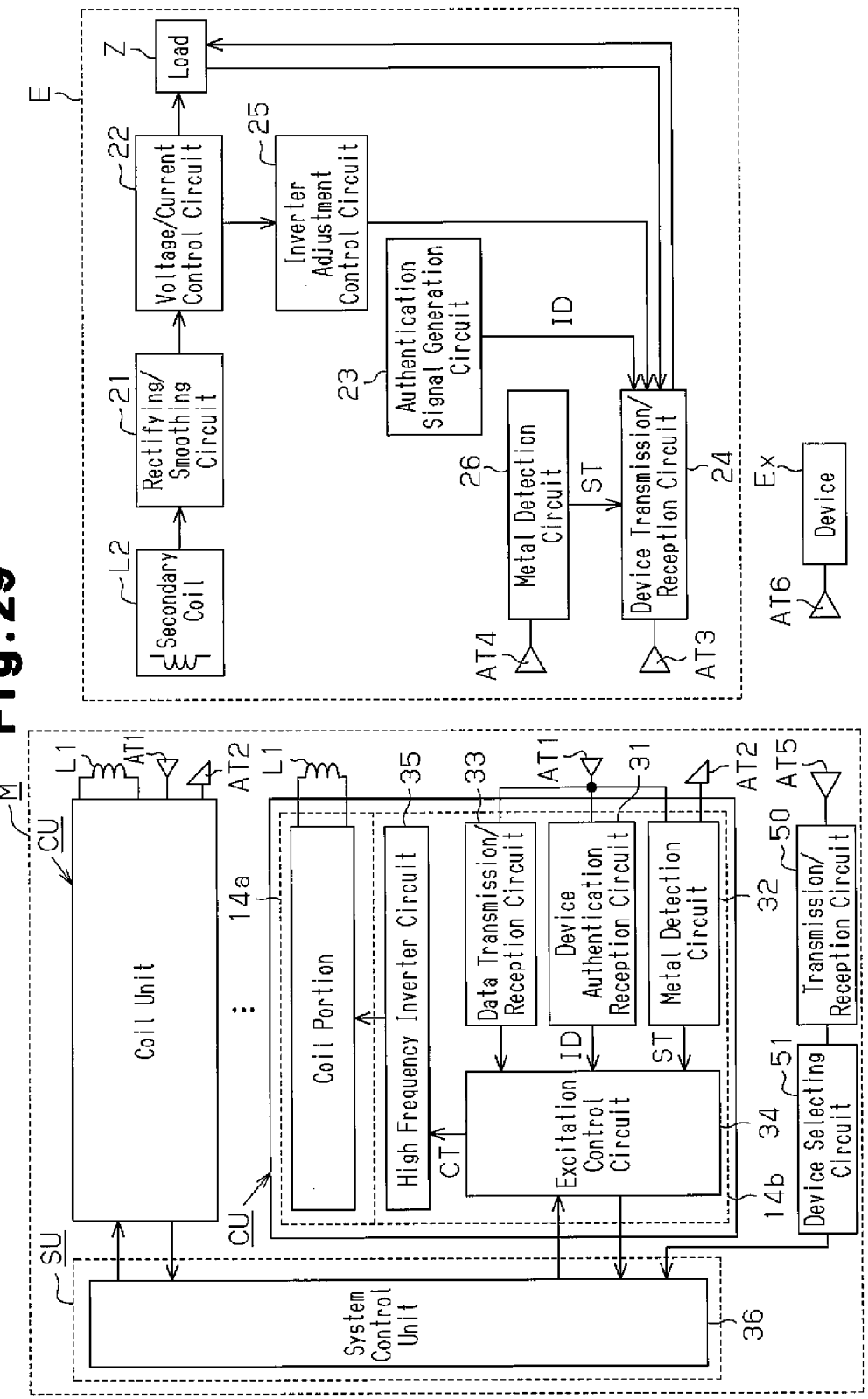
FIG. 29 is an electric circuit diagram showing an electrical configuration of the power supplying device.

In this case, the plurality of coil units CUa and the plurality of drive units CUb are arranged on the printed wiring substrate 10 within the power suppliable region ARx, and a transmission/reception antenna AT5 for receiving the transmission signal transmitted from the device Ex of another standardized specification is also arranged (see FIG. 29). A device selecting circuit (see FIG. 29) for decoding the transmission signal transmitted from the device Ex of another standardized specification, determining the power supplying method for the standard and property of the device Ex of another standardized specification, and controlling the coil unit CUa arranged on the printed wiring substrate 10 within the power suppliable region ARx through the drive unit CUb needs to be arranged.

FIG. 29 shows an electric circuit diagram applied to the power supplying module M of the first embodiment. The transmission signal transmitted from the transmission antenna AT6 of the device Ex of another standardized specification is received by the transmission/reception antenna AT5. The transmission signal from the device Ex of another standardized specification received by the transmission/reception antenna AT5 is output to the device selecting circuit 51 through the transmission/reception circuit 50. The device selecting circuit 51 determines the power supplying method for the standard and property of the device Ex of another standardized specification is from the transmission signal, and outputs the determined information to the system control unit 36.

The system control unit 36 excites and controls the primary coil L1 of the coil unit CU through the drive portion 14b of the coil unit CU within the power suppliable region ARx, in which the device Ex of another standardized specification is arranged, based on the power supplying method determined by the device selecting circuit 51.

The contactless power supplying device 1 (power supplying module M) thus can respond to the device Ex of another standardized specification, and hence the convenience increases.

The contactless power supplying device 1 (power supplying module M) may add a mark, or the like to one section where the device Ex of another standardized specification can be arranged to display that the device Ex of another standardized specification can be responded.

In the second embodiment, the depth of the plurality of coil unit fitting recesses 11a, the plurality of drive unit fitting recesses 11b, and the single system unit fitting recess 12 is the depth at which the plurality of coil units CUa, the plurality of drive units CUb, and the single system unit SU project out from the upper surface 10a, but may be the depth at which the upper surfaces of the plurality of coil units CUa, the plurality of drive units CUb, and the single system unit SU are flush with the upper surface 10a of the printed wiring substrate 10, or the emerging depth.

In the second embodiment, the plurality of coil unit fitting recesses 11a, the plurality of drive unit fitting recesses 11b, and the single system unit fitting recess 12 are formed, and the plurality of coil units CUa, the plurality of drive units CUb, and the single system unit SU are fitted into the plurality of coil unit fitting recesses 11a, the plurality of drive unit fitting recesses 11b, and the single system unit fitting recess 12, but the plurality of coil unit fitting recesses 11a, the plurality of drive unit fitting recesses 11b, and the single system unit fitting recess 12 may be omitted.

In the second embodiment, the system unit SU is coupled to the printed wiring substrate 10 as the power supplying module M, but the power supplying module M may be configured such that the system unit SU is omitted and the plurality of coil units CUa and the plurality of drive units CUb are coupled to the printed wiring substrate 10.

Furthermore, the power supplying module M in which the system unit SU and the drive unit CUb are omitted, and the plurality of coil units CUa are coupled to the printed wiring substrate 10 may be obtained.

In the second embodiment, each drive unit CUb includes the device authentication reception circuit 31, the metal detection circuit 32, the data transmission/reception circuit 33, the excitation control circuit 34, and the high frequency inverter circuit 35. Each drive unit CUb may have all or at least one of the device authentication reception circuit 31, the metal detection circuit 32, the data transmission/reception circuit 33, and the excitation control circuit 34 excluding the high frequency inverter circuit 35 omitted. If all of the configuring elements mentioned above are omitted, the detection of the device E is detected with another means, and the system control unit 36 drives and controls the high frequency inverter circuit 35 based on such detection.

In the second embodiment, the plurality of electrodes P are arranged on the system unit SU, each coil unit CUa, and each drive unit CUb, and the plurality of pads PD are formed on the bottom surfaces S2, S1a, S1b of the fitting recesses 12, 11a, 11b for electrically flip-chip joining.

The plurality of electrodes P of the system unit SU, each coil unit CUa, and each drive unit CUb are changed to a male-type contact plug terminal. A female-type contact plug terminal is attached to the bottom surfaces Ss, S1a, S1b of the fitting recesses 12, 11a, 11b of the printed wiring substrate 10. The male-type contact plug terminal may be fitted into and electrically connected to the female-type contact plug terminal.

Apparently, the power supplying module M may be applied to the first embodiment.

In the second embodiment, each coil unit CUa has the primary coil L1 wound around the core C in the same manner as the first embodiment. However, the primary coil L1 does not have to be wound around the core C. This also applied for each primary coil L1 of the first embodiment.

Each coil unit CU, CUa of the second embodiment is a cuboid but is not limited in such a manner and may have any shape such as a cube, a circular column body, a pot, and the like. The shape of the core C around which each primary coil L1 is wound may be appropriately changed accordingly. In the same manner in the first embodiment, the shape of the coil unit CU may apparently be changed.

The plurality of coil units CUa have the same specification and the plurality of primary coils L1 of the plurality of coil units CUa also have the same specification. However, for example, only the number of windings of the plurality of primary coils L1 may be changed without changing the outer shape of the plurality of coil units CUa.

In the second embodiment, the insulator having a thickness is arranged on the plurality of coil units CUa arranged on the printed wiring substrate 10, and suppliable power to the device E is changed by changing the thickness of the insulator. In the insulating resin 13 that molded each coil unit CUa, the thickness of the upper surface portion of the coil unit CUa may be appropriately changed.

Thus, the receiving power and the receiving voltage of the device E can be changed even in the contactless power supplying device 1 (power supplying module M) having the same supplying power performance by changing the distance between the contactless power supplying device 1 (power supplying module M) and the device E. This allows for power to be supplied to further various devices E.

In the same manner, also in the first embodiment, the receiving power and the receiving voltage of the device E may be changed by changing the distance between the contactless power supplying device 1 (power supplying module M) and the device E with the insulator.

In the first embodiment and the second embodiment, the magnitude of the secondary power obtained by the arrangement combination of the coil unit CU (CUa) of the device E with respect to the arrangement of the plurality of coil units CU (CUa) of the power supplying module M can be varied. In other words, since the magnetic flux density on the surface can be increased by closely arranging the plurality of coil units CU (CUa), the distance for obtaining the same secondary power (distance from the coil unit CU (CUa) to the secondary coil L2) can be increased even with the secondary coil L2 having the same coil area.

For example, in the power supplying module M shown in FIG. 11, FIG. 12, and FIG. 13, each coil unit CU (CUa) can supply power to a maximum of 10 W. The magnetic flux density on the surface of the power supplying module M shown in FIG. 12 is the largest. The magnetic flux density on the surface of the power supplying module M shown in FIG. 11 is the same as the magnetic flux density on the surface of the power supplying module M shown in FIG. 13. Also, the magnetic flux density on the surface of the power supplying module M shown in FIG. 11 and FIG. 13 is smaller than the magnetic flux density on the surface of the power supplying module M shown in FIG. 12.

Furthermore, if the secondary coil L2 of the device E on the left side shown in FIG. 11, the secondary coil L2 of the device E on the right side shown in FIG. 13, and the secondary coil L2 of the device E on the left side shown in FIG. 13 have the same coil area and are coils for 20 W, the distance at which the power can be received while maintaining the secondary output voltage at 48 V becomes the longest when using the power supplying module M in which the magnetic flux density on the surface of the power supplying module M shown in FIG. 12 is the largest. That is, when the magnetic flux density on the surface of the power supplying module M is large, the distance from the coil unit CU (CUa) to the secondary coil L2 at which the same secondary power can be obtained can be increased even with the secondary coil L2 having the same coil area.

In the first embodiment (In the same manner in the second embodiment), the wiring pattern is laid on the printed wiring substrate 10 to electrically connect the system unit SU and each coil unit CU. However, such wiring pattern may be omitted.

Figure 30:
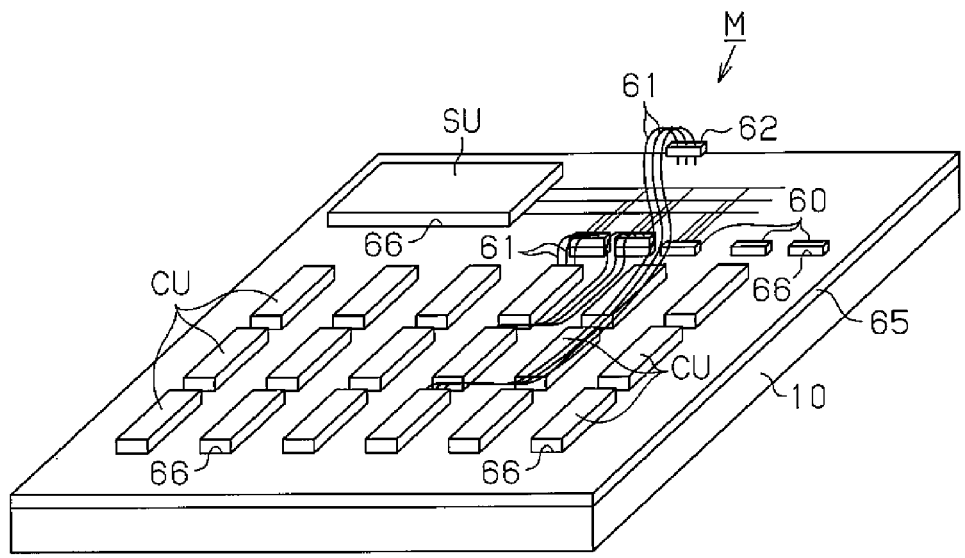
FIG. 30 is schematic diagram showing another method for forming the coil unit fitting recess and the system unit fitting recess.

In this case, as shown in FIG. 30, a plurality of (partially omitted) connectors 60 are arranged at one area of the printed wiring substrate 10 to electrically connect the system unit SU and each coil unit CU. A lead wire 61 (partially omitted) is connected to each coil unit CU, and a plug 62 is arranged at a distal end of the lead wire 61. Each coil unit CU is connected by inserting its plug 62 to the corresponding connector 60. Each coil unit CU is thereby controlled by the system unit SU through the lead wire 61.

In this case, a complex wiring pattern is not formed on the printed wiring substrate 10 to electrically connect the system unit SU and each coil unit CU through the lead wire 61. Therefore, the manufacturing of the printed wiring substrate 10 is facilitated and is thus inexpensive. This reduces the cost of the entire power supplying module M.

Furthermore, as shown in FIG. 30, the plurality of coil unit fitting recesses 11 and the system unit fitting recess 12 of the printed wiring substrate 10 are omitted, and instead, a recess forming plate 65 including an insulating plate made of synthetic resin, or the like is arranged. A through-hole 66 is formed at positions corresponding to the plurality of coil unit fitting recesses 11 and the system unit fitting recess 12 of the recess forming plate 65, and the connector 60.

The recess forming plate 65 is securely attached to the upper surface of the printed wiring substrate 10 in which the plurality of coil unit fitting recesses 11 and the system unit fitting recess 12 are omitted. The coil unit fitting recess 11 is thereby formed at the position where each coil unit CU is to be arranged, and the system unit fitting recess 12 is formed at the position where the system unit SU is to be arranged.

In this case, the formation of the plurality of coil unit fitting recesses 11 and the system unit fitting recess 12 on the expensive printed wiring substrate 10 is omitted, and the inexpensive recess forming plate 65 can be used instead. This reduces costs. In particular, the cost decreases as the size of the printed wiring substrate 10 increases.

In the first embodiment (In the same manner in the second embodiment), each coil unit CU is arranged on the printed wiring substrate 10 in a lattice form such that the coil units adjacent in the left-right and front-back directions face each other at equal intervals.

Figure 31:
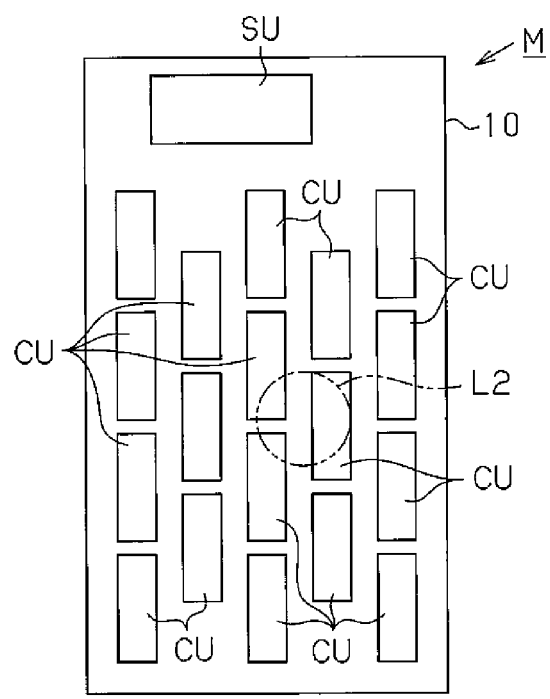
FIG. 31 is a diagram showing another arrangement method of the coil unit.

This may be realized by arranging the plurality of cuboid coil units CU on the upper surface of the printed wiring substrate 10 in a zigzagged manner, as shown in FIG. 31. In such an arrangement, the device E can be detected, and the power supplying module M of higher power supplying efficiency can be obtained.

Figure 32A:
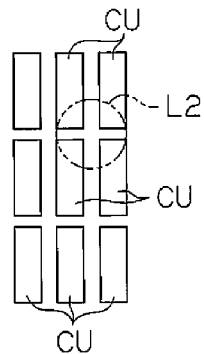
FIG. 32(a) is a diagram showing a positional relationship with the secondary coil when the coil units are arranged in a lattice form.
Figure 32B:
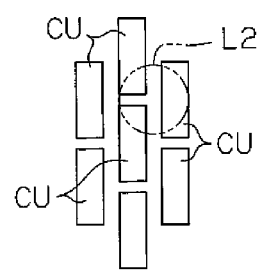
FIG. 32(b) is a diagram showing a positional relationship with the secondary coil of when the coil units are arranged in a zigzagged manner.

In other words, FIG. 32(a) shows a case in which the plurality of coil units CU are arranged in a lattice form. FIG. 32(b) shows a case in which the plurality of coil units CU are arranged in a zigzagged manner.

The secondary coil L2 of the device E is arranged at a position shown with by double-dashed lines in FIG. 32(a) and FIG. 32(b).

When the coil units CU are arranged in a lattice form as shown in FIG. 32(a), four coil units CU need to be excited depending on the location. Furthermore, unnecessary magnetic flux increases and lowers efficiency. Since the area where the secondary coil L2 is provided is small in all four coil units CU, that is, only the ends of the secondary coil L2 are provided in the four coil units CU, detection of the secondary coil L2 located immediately above may be hindered, and power may not be supplied.

On the contrary, when the plurality of coil units CU are arranged in a zigzagged manner as shown in FIG. 32(b), the area where the secondary coil L2 of the device E is provided becomes large in one of the coil units CU. As a result, detection can be ensured when the secondary coil L2 is located immediately above. This ensures that power is supplied.

Figure 33:
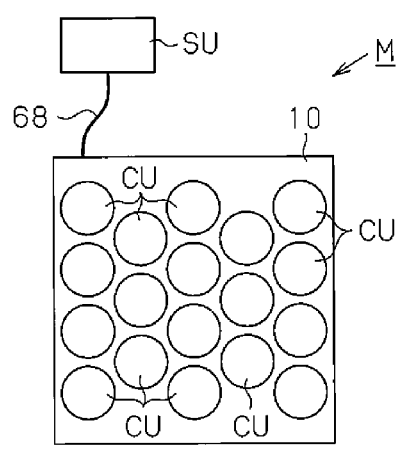
FIG. 33 is a diagram showing the system unit separated from the printed wiring substrate.

The plurality of cuboid coil units CU are arranged in a zigzagged manner in FIG. 31. Instead, a plurality of circular column-shaped (circular plane) coil units CU may be arranged in a zigzagged manner, as shown in FIG. 33. In this case, the assembly of the system unit SU to the printed wiring substrate 10 may be omitted, and a connector (not shown) arranged on the printed wiring substrate 10 and a connector (not shown) arranged on a substrate (not shown) including with the system unit SU may be electrically connected with a wire harness 68.

Thus, by separating the system unit SU from the printed wiring substrate 10, the size of the printed wiring substrate 10 of the power supplying module M can be reduced accordingly, and the thickness can be reduced by the amount the system unit SU, which is thicker than the coil unit CU, is omitted. As a result, the power supplying module M can be smoothly incorporated without strangeness to the top plate of a table and housing architectural material, and the system unit SU that somewhat has a thickness can be installed in an area that does not become a hindrance even if formed to be thick by the wire harness 68. The thickness of the power supplying surface can thus be reduced.

In the first embodiment (also in the second embodiment), the coil unit CU and the system unit are arranged on the printed wiring substrate 10.

Figure 34:
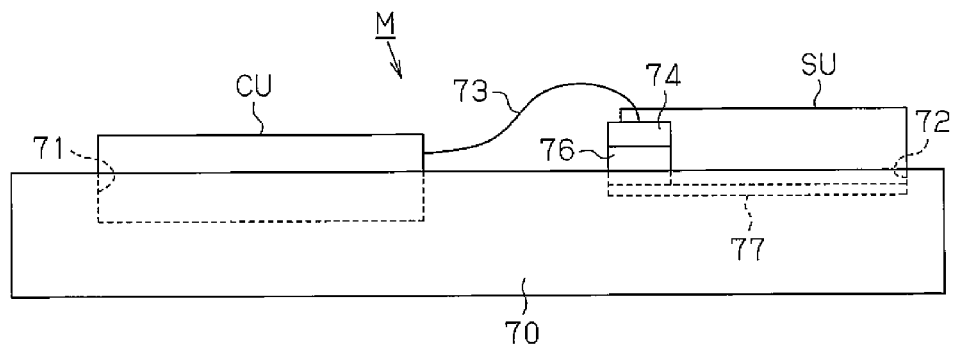
FIG. 34 is a side view showing a state in which the coil units and the system unit are arranged on a mold frame.

As shown in FIG. 34, the coil unit CU and the system unit may be arranged on a mold form 70 including an insulating plate made of synthetic resin and the like, in place of the printed wiring substrate 10.

That is, as shown in FIG. 34, a plurality of coil unit fitting recesses 71 and the single system unit fitting recess 72 are formed at positions corresponding to the plurality of coil unit fitting recesses 11 and the single system unit fitting recess 12 on the mold frame 70 including the insulating plate made of synthetic resin and the like.

A lead wire 73 is connected to each coil unit CU, and a plug 74 is arranged at a distal end of each lead wire 73. The system unit SU is set on a wiring substrate 77, on which the connector 76 to be connected with each plug 74 is mounted.

The coil unit CU connected with the lead wire 73 is fitted into and securely attached to the plurality of coil unit fitting recesses 71. The wiring substrate 77 mounted with the connector 76 and the system unit SU is fitted into and securely attached to the system unit fitting recess 72.

Then, each coil unit CU inserts and connects its plug 74 to the corresponding connector 76. Each coil unit CU is thereby controlled by the system unit SU through the lead wire 73.

In this case, the inexpensive mold form 70 can be substituted in place of the expensive printed wiring substrate 10, and thus the cost of the power supplying module M can be reduced. In particular, the cost reduces the larger the power supplying module M.

DESCRIPTION OF REFERENCE CHARACTERS

1: contactless power supplying device
2: housing
3: box body
4: top plate
5: setting surface
10: printed wiring substrate
10a: upper surface
11, 11a: coil unit fitting recess
12: system unit fitting recess
13, 15: insulating resin
14a: coil portion
14b: drive portion
17: device
18: circuit substrate
21: rectifying/smoothing circuit
22: voltage/current control circuit
23: authentication signal generation circuit
24: device transmission/reception circuit
25: inverter adjustment control circuit
26: metal detection circuit
31: device authentication reception circuit (device authentication unit)
32: metal detection circuit (metal detection unit)
33: data transmission/reception circuit (data transmission/reception unit)
34: excitation control circuit
35: high frequency inverter circuit
36: system control unit
41: magnetic sheet
42: wall
44: column
45: accommodation box
45a to 45e: plate
46: floor plate
48, 49: capacitor
50: transmission/reception circuit
51: device selecting circuit
60: connector
61: lead wire
62: plug
65: recess forming plate
66: through-hole
68: wire harness
70: mold frame
71: coil unit fitting recess
72: system unit fitting recess
73: lead wire
74: plug
76: connector
77: wiring substrate
AT1: signal reception antenna (reception unit)

AT2: metal detection antenna (metal detection means)
AT3: transmission/reception antenna
AT4: metal detection antenna
AT4: transmission/reception antenna
AT6: transmission antenna
AR, ARx: power suppliable region
E, Ex: device
M: power supplying module
C: core
CU, CUa: coil unit
CUb: drive portion
SU: system unit
IN: wiring
L1: primary coil
L2: secondary coil
P: electrode
PD: pad
S1, S1a, S1b, S2: bottom surface
ID: device authentication signal
ST: metal-present signal
Z: load

The invention claimed is:

1. A power supplying module for a contactless power supplying device, the power supplying module comprising:
a plurality of coil units, wherein each of the coil units includes a primary coil and one or more first terminals, and when the primary coil is excited and a secondary coil of a device is arranged adjacent to the primary coil, secondary power is generated by electromagnetic induction at the secondary coil, and the secondary power is supplied to a load of the device; and
a printed wiring substrate including
a plurality of first layout regions respectively defined for arrangement of the coil units, wherein each of the first layout regions includes one or more second terminals for connection to the one or more first terminals of the corresponding coil unit, and
one or more wires formed on the printed wiring substrate to drive the coil unit arranged in each of the first layout regions;
wherein the coil units are arranged on the printed wiring substrate by arranging the coil units in the first layout regions of the printed wiring substrate and connecting the one or more second terminals of each first layout region to the one or more first terminals of each coil unit, wherein
each of the first layout regions formed on the printed wiring substrate is a coil unit fitting recess into which the coil unit is fitted; and
each of the coil unit fitting recesses includes
a bottom surface, and
the one or more second terminals formed on the bottom surface of each of the coil unit fitting recesses and jointed to the one or more first terminals of the coil unit that is fitted.

2. The power supplying module for a contactless power supplying device according to claim 1, wherein the first layout regions are defined to set a linear power suppliable region in which the coil units are arranged on the printed wiring substrate in a single line in either one of a front-back direction and a left-right direction.

3. The power supplying module for a contactless power supplying device according to claim 1, wherein the first layout regions are defined to set a planar power suppliable region in which the coil units are arranged in front-back and left-right directions on the printed wiring substrate is set.

4. The power supplying module for a contactless power supplying device according to claim 3, wherein
the coil units arranged in the front-back and left-right directions on the printed wiring substrate satisfy "A"<"F" and "B"<"F", where
"A" represents the distance between two coil units adjacent in the left-right direction, "B" represents the distance between two coil units adjacent in the front-back direction, and
"F" represents the longest distance among a side and a diameter or a diagonal line of the secondary coil of a device, which includes the secondary coil having the smallest coil area, among devices usable for the power supplying module.

5. The power supplying module for a contactless power supplying device according to claim 1, wherein the plurality of first layout regions are defined to set a circular or a sector-shaped power suppliable region so that the coil units are arranged at different angles relative to the printed wiring substrate.

6. The power supplying module for a contactless power supplying device according to claim 1, wherein the coil units have the same specification.

7. The power supplying module for a contactless power supplying device according to claim 1, wherein each of the coil units includes a coil portion having the primary coil, a drive portion with an inverter circuit that excites the primary coil, and an insulating resin that integrally molds the coil portion and the drive portion.

8. The power supplying module for a contactless power supplying device according to claim 1, wherein each of the coil units includes a reception unit that receives a signal from the device.

9. The power supplying module for a contactless power supplying device according to claim 1, wherein each of the coil units includes at least one of a device authentication unit, a metal detection unit, and a data transmission/reception unit, which transmits and receives data to and from the device.

10. The power supplying module for a contactless power supplying device according to claim 1, wherein the primary coils of each of the coil units are wound around a core formed by a magnetic body.

11. The power supplying module for a contactless power supplying device according to claim 1, comprising a resonance capacitor connected to the primary coil of each of the coil units.

12. The power supplying module for a contactless power supplying device according to claim 1, wherein the primary coil of each of the coil units has a cuboid shape.

13. The power supplying module for a contactless power supplying device according to claim 1, comprising an insulator arranged on the coil units arranged on the printed wiring substrate, wherein power suppliable to the device is set by changing a thickness of the insulator.

14. The power supplying module for a contactless power supplying device according to claim 1, comprising:
a system unit that centrally drives and controls each of the coil units and includes a plurality of third terminals; and
a second layout region defined and formed on the printed wiring substrate for arrangement of the system unit, wherein
the second layout region includes a plurality of fourth terminals respectively connected to the third terminals of the system unit, and
the third terminals of the system unit and the one or more first terminals of each coil unit are electrically connected.

15. The power supplying module for a contactless power supplying device according to claim 1, comprising a power suppliable region section that is defined on the printed wiring substrate and is applicable to a device of a further standardized specification,
 wherein a plurality of coil units for the device of the further standardized specification are arranged in the power suppliable region section.

16. The power supplying module for a contactless power supplying device according to claim 1, comprising a magnetic member that electromagnetically shields the coil unit in the coil units arranged on the printed wiring substrate.

17. A method for using the power supplying module of a contactless power supplying device according to claim 1, the method comprising planarly arranging a plurality of identical power supplying modules in conformance with a power suppliable region.

18. The method for using the power supplying module of a contactless power supplying device according to claim 1, further comprising three-dimensionally arranging a plurality of identical power supplying modules in conformance with a power suppliable region.

19. A method for manufacturing a power supplying module of a contactless power supplying device, the method comprising:
 preparing a printed wiring substrate and a plurality of coil units, wherein
  each of the coil units includes
   a primary coil and one or more first terminals, wherein when the primary coil is excited and the secondary coil of the device is arranged adjacent to the primary coil, secondary power is generated by electromagnetic induction at the secondary coil, and the secondary power is supplied to a load of the device, and the printed wiring substrate includes
   a plurality of first layout regions respectively defined for arrangement of the coil units,
   one or more second terminals formed in each of the first layout regions for connection to the one or more first terminals of the corresponding coil unit, and
   one or more wires formed on the printed wiring substrate to drive the coil unit arranged in each of the first layout regions;
 arranging the coil units in at least one of the first layout regions of the printed wiring substrate;
 connecting the one or more second terminals of the first layout region in which the coil units are arranged and the one or more first terminals of the corresponding coil unit; and
 coupling the plurality of coil units to the printed wiring substrate,
 wherein
 the first layout regions formed on the printed wiring substrate are coil unit fitting recesses to which the coil units are fitted; and
 each of the coil unit fitting recesses includes
  a bottom surface, and
  the one or more second terminals formed on the bottom surface of each of the coil unit fitting recesses and jointed to the one or more first terminals of the coil unit that is fitted.

20. The method for manufacturing a power supplying module of a contactless power supplying device according to claim 19, wherein the arranging includes
 arranging the coil units in all of the first layout regions formed in the printed wiring substrate, and respectively coupling the coil units to all of the first layout regions of the printed wiring substrate.

21. The method for manufacturing the power supplying module of a contactless power supplying device according to claim 19, wherein the arranging includes
 selecting one or more of the first layout regions formed in the printed wiring substrate in accordance with a preset power suppliable region, arranging the coil unit in the selected first layout region on the printed wiring substrate, and coupling the coil units to the selected first layout region on the printed wiring substrate.

22. The method for manufacturing the power supplying module of a contactless power supplying device according to claim 19, wherein the coil units have the same specification.

23. The method for manufacturing the power supplying module of a contactless power supplying device according to claim 19, wherein the one or more second terminals formed in each of the first layout regions on the printed wiring substrate are flip-chip connected to the one or more first terminals formed in each of the coil units.

24. The method for manufacturing the power supplying module of a contactless power supplying device according to claim 19, wherein the one or more second terminals formed in each of the first layout regions on the printed wiring substrate are connected by a male-type contact plug terminal and a female-type contact plug terminal to the one or more terminals formed in each of the coil units.

* * * * *